US012596301B2

(12) United States Patent
Zhou et al.

(10) Patent No.: US 12,596,301 B2
(45) Date of Patent: Apr. 7, 2026

(54) RETICLE INSPECTION AND PURGING METHOD AND TOOL

(71) Applicants: TAIWAN SEMICONDUCTOR MANUFACTURING COMPANY, LTD., Hsinchu (TW); TSMC CHINA COMPANY LIMITED, Shanghai (CN)

(72) Inventors: Xianhui Zhou, Shanghai City (CN); Lei Wang, Shanghai City (CN); Zihao Zhang, Shanghai City (CN); Huiming Xu, Shanghai City (CN)

(73) Assignees: TAIWAN SEMICONDUCTOR MANUFACTURING COMPANY, LTD., Hsinchu (TW); TSMC CHINA COMPANY LIMITED, Shanghai (CN)

( * ) Notice: Subject to any disclaimer, the term of this patent is extended or adjusted under 35 U.S.C. 154(b) by 476 days.

(21) Appl. No.: 18/173,287

(22) Filed: Feb. 23, 2023

(65) Prior Publication Data

US 2024/0103359 A1    Mar. 28, 2024

(30) Foreign Application Priority Data

Sep. 23, 2022    (CN) .......................... 202222529046.5

(51) Int. Cl.
*G03F 1/84*          (2012.01)
*G03F 7/00*          (2006.01)
(52) U.S. Cl.
CPC ............ *G03F 1/84* (2013.01); *G03F 7/70741* (2013.01)
(58) Field of Classification Search
CPC .......... G03F 1/84; G03F 1/00; G03F 7/70741; G03F 1/82; G03F 7/70925; B25J 11/0095; B25J 9/042; B25J 15/0014; B25J 15/0052; B25J 15/00; H01L 21/67742; H01L 21/68707; H01L 21/67766; H01L 21/68

See application file for complete search history.

(56) References Cited

U.S. PATENT DOCUMENTS

| 10,156,527 | B2 * | 12/2018 | Janik | G01N 21/94 |
| 2011/0268547 | A1 * | 11/2011 | Doll | B65G 47/90 |
| | | | | 414/661 |
| 2014/0205179 | A1 * | 7/2014 | Li | G06T 7/001 |
| | | | | 382/144 |
| 2020/0057385 | A1 * | 2/2020 | Liao | G03F 1/84 |
| 2020/0133143 | A1 * | 4/2020 | Lan | G03F 9/7019 |
| 2021/0256686 | A1 * | 8/2021 | Chen | G06T 7/0004 |
| 2022/0062955 | A1 * | 3/2022 | Chuang | G03F 1/82 |
| 2022/0299882 | A1 * | 9/2022 | Huang | G03F 7/70033 |
| 2022/0342321 | A1 * | 10/2022 | Chang | G03F 7/70741 |

FOREIGN PATENT DOCUMENTS

| CN | 216596014 | U | * | 5/2022 | |
| KR | 20060114803 | A | * | 11/2006 | G03F 1/84 |

* cited by examiner

*Primary Examiner* — Siamak Harandi
*Assistant Examiner* — Jaspreet Kaur
(74) *Attorney, Agent, or Firm* — Maschoff Brennan

(57) ABSTRACT

A reticle inspection and purging method comprises following steps. A first reticle is moved from a first load port of a lithography tool to a reticle inspection tool located outside the lithography tool. The first reticle is inspected using the reticle inspection tool located outside the lithography tool. Whether the first reticle is acceptable for exposure is determined based on the inspection result. In response the determination determines that the first reticle is not acceptable for exposure, the first reticle is purged.

20 Claims, 19 Drawing Sheets

122b

314

P32

P31

340

X

Y

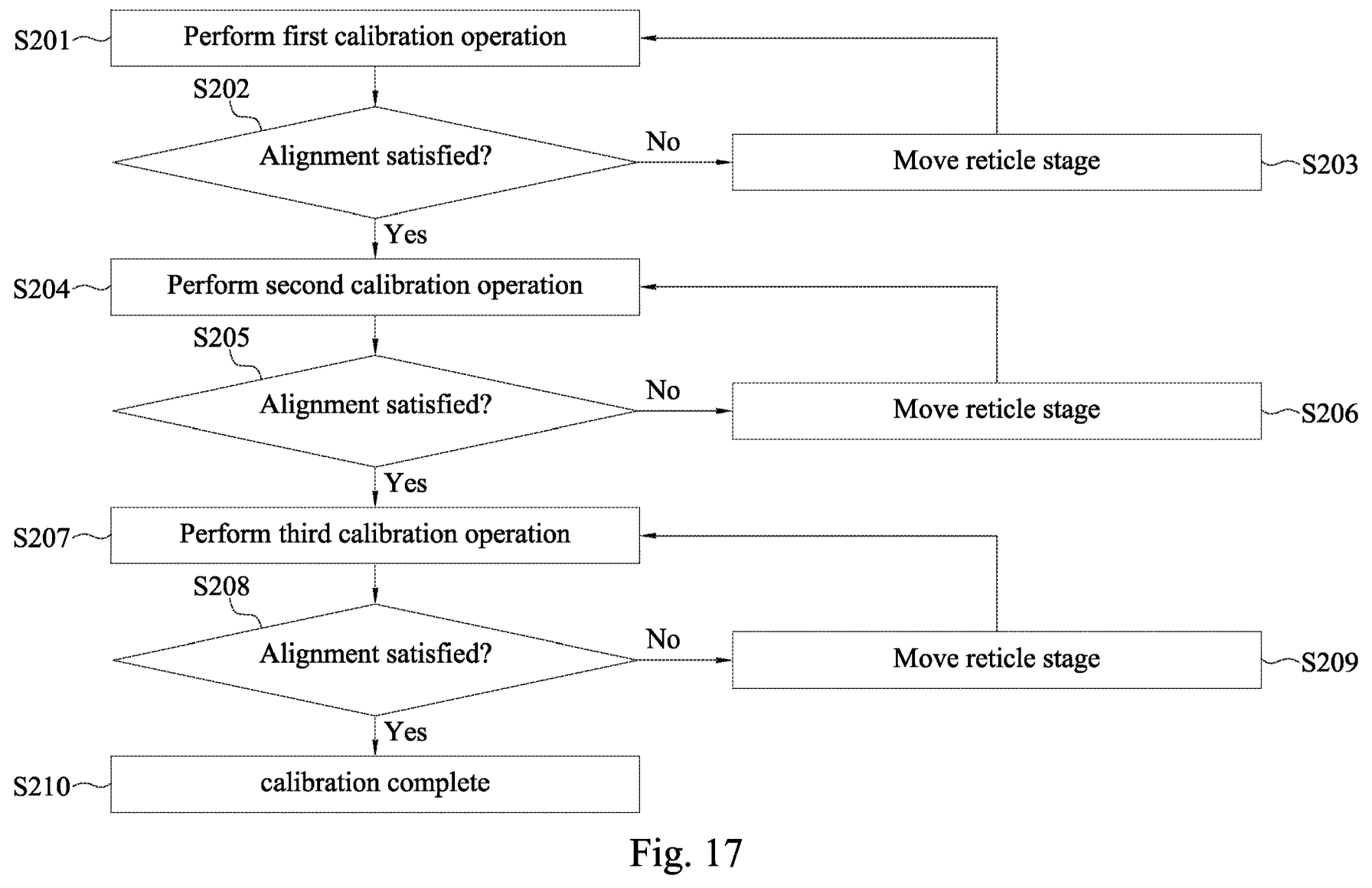

S201 — Perform first calibration operation

S202 — Alignment satisfied?

No → S203 — Move reticle stage

Yes

S204 — Perform second calibration operation

S205 — Alignment satisfied?

No → S206 — Move reticle stage

Yes

S207 — Perform third calibration operation

S208 — Alignment satisfied?

No → S209 — Move reticle stage

Yes

S210 — calibration complete

Fig. 17

RETICLE INSPECTION AND PURGING METHOD AND TOOL

PRIORITY CLAIM AND CROSS-REFERENCE

The present application claims priority to China Application Serial Number 202222529046.5, filed Sep. 23, 2022, which is herein incorporated by reference in its entirety.

BACKGROUND

A lithography process is used in a semiconductor device fabrication process whereby the lithography process transfers patterns of photomasks (also referred to as masks or reticles) to a target substrate, typically a semiconductor substrate having a photosensitive layer disposed thereon. If the mask has a defect, the defect is likewise transferred to the target substrate as a defect in the pattern developed onto the substrate. The defect may produce yield, quality, or reliability issues for the resulting semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 17 is a flow chart illustrating an example calibration operation according to some embodiments of the present disclosure.

DETAILED DESCRIPTION

Figure 1:
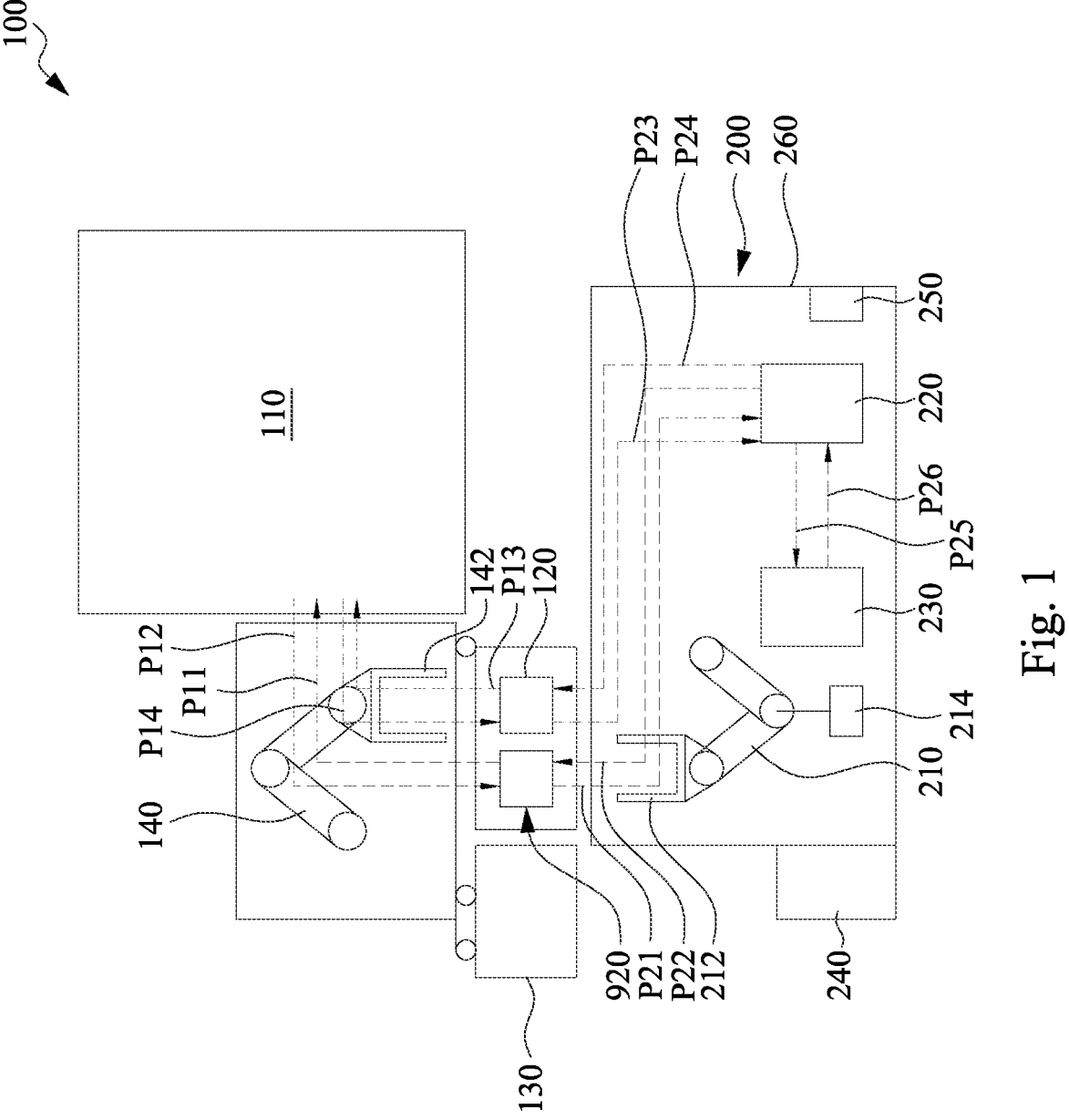
FIG. 1 is a plan view illustrating an example lithography tool and a stand-alone reticle inspection and purging tool placed adjacent the lithography tool, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Automated material handling system (AMHS) used in the semiconductor fabrication field includes a plurality of bays (rows) of storage areas. Each bay has a stocker, which includes bins for holding a plurality of containers, such as standard mechanical interface (SMIF) containers for loading 200 mm (8 inch) wafers, or front opening unified pods (FOUPs), which may be used to load 300 mm (12 inch) wafers. The stocker holds the SMIFs or FOUPs in preparation for transporting a SMIF or FOUP to the load port of a processing tool. In technologies using larger critical dimensions (CD) and 200 mm wafers, a photomask stocker stores and delivers photomasks for use in photolithographic processes. An overhead hoist transport (OHT) associated with each bay transports the SMIF or FOUP with wafers, or the pod with a reticle, from the respective stocker to a load port for processing in one of the tools (fabrication process machines). However, after transportation or lithography processes, some foreign particles may falls onto the reticle and thus damage the reticle. An integrated reticle inspection system (IRIS) may be embedded in the lithography tool. The IRIS in the lithography tool serves to perform reticle inspection before running the UV lithography exposure. If identified particles exceed acceptable threshold, the reticle will be transferred out of the lithography tool to operators/engineers for manually purging the reticle. The reticle inspection and purging operations cause lithography throughput degradation because the exposure tool may be in an idle condition during the reticle inspection and purging operations.

The present disclosure, in some embodiments, provides a stand-alone reticle inspection and purging separated from the lithography tool. The lithography tool will mainly perform the exposure operation without performing the reticle inspection and purging operations. Thus, the exposure operation can be performed during the reticle inspection and purging operations. Therefore, there is no idle time for reticle inspection and purging operations, which in turn will increase the lithography throughput.

FIG. 1 illustrates an example lithography tool 100 and a stand-alone reticle inspection and purging tool 200 placed adjacent the lithography tool 100, according to some embodiments of the present disclosure. In some embodiments, a lithography tool 100 includes, for example, an exposure tool 110, a plurality of load ports 120, an operator interface 130 and a transfer module 140. The exposure tool 110 may be, for example, an exposure scanner configured to perform an exposure process on a semiconductor substrate using an inspected and purged reticle. In some embodiments, the exposure tool includes an ultraviolet (UV) light source or an extreme UV (EUV) light source. A reticle is loaded into or unloaded from the exposure tool 110 through one of the load ports 120. The operator interface 130 allows an operator to control and monitor transportation and condition of the photomask and the semiconductor substrate.

The transfer module 140 is configured to transfer an inspected reticle between the load port 120 and the exposure tool 110. In particular, the transfer module 140 includes a robot arm 142 assigned with a bi-direction transportation path between one of the load ports 120 and the exposure tool 110. In greater detail, the transfer module 140 is assigned with a transportation path P11 from a first one of load ports 120 to the exposure tool 110, and an opposite transportation path P12 from the exposure tool 110 to the first one of load ports 120. The transfer module 140 is also assigned with a transportation path P13 from a second one of load ports 120 to the exposure tool 110, and an opposite transportation path P14 from the exposure tool 110 to the second one of load ports 120. In this way, the transfer module 140 can either transport an inspected reticle from a reticle pod 920 (also called a carrier or a box) placed on a corresponding load port 120 to a reticle table within the exposure tool 110, or transport an used reticle from the reticle table within the exposure tool 110 to a corresponding reticle pod 920.

A stand-alone reticle inspection/purging tool 200 is placed adjacent the lithography tool 100 and configured to perform reticle inspection and purging operations for uninspected reticles. Therefore, no integrated reticle inspection system (IRIS) module is required in the lithography tool 100, and thus the transfer module 140 within the lithography tool 100 is not assigned with a transportation path between the load port 120 and an IRIS module. Instead, the stand-alone reticle inspection/purging tool 200 includes a transfer module 210, a reticle inspection tool 220, and a reticle purging tool 230 that cooperate to perform reticle inspection and purging operations outside the lithography tool 100. The stand-alone reticle inspection/purging tool 200 further includes an operator interface 240 that displays reticle inspection history and results, defect types, sizes, positions and images, hardware status and options for tool maintenance. The operator interface 240 allows an operator to control and monitor the reticle inspection and purging operations. In some embodiments, the stand-alone reticle inspection/purging tool 200 further includes an exhaust pipe 250 to exhaust gas from an interior of a chamber 260 of the tool 200 to an exterior of the chamber 260 of the tool 200, so as to keep reducing particles in the chamber 260.

The transfer module 210 is external to the lithography tool 100, and thus it can be interchangeably referred to as an "external" transfer module 210 different from the "internal" transfer module 140 that is housed within the lithography tool 100. In some embodiments, the external transfer module 210 has a robot arm 212 assigned with various bi-directional transportation paths for reticle inspection and purging.

For example, the external transfer module 210 is assigned with a transportation path P21 from a first one of the load ports 120 to the inspection tool 220, and an opposite transportation path P22 from the inspection tool 220 to the first one of the load ports 120. In this way, the robot arm 212 of the external transfer module 210 can either transport an uninspected reticle from the first one of the load ports 120 to the inspection tool 220, or transport an inspected reticle from the inspection tool 220 back to the first one of the load ports 120.

The external transfer module 210 is further assigned with a transportation path P23 from a second one of the load ports 120 to the inspection tool 220, and an opposite transportation path P24 from the inspection tool 220 to the second one of the load ports 120. In this way, the robot arm 212 of the external transfer module 210 can either transport an uninspected reticle from the second one of the load ports 120 to the inspection tool 220, or transport an inspected reticle from the inspection tool 220 back to the second one of the load ports 120.

The external transfer module 210 is further assigned with a bi-directional transportation path between the reticle inspection tool 220 and the reticle purging tool 230. For example, the external transfer module 210 is assigned with a transportation path P25 from the reticle inspection tool 220 to the reticle purging tool 230, and an opposite transportation path P26 from the reticle purging tool 230 to the reticle inspection tool 220. In this way, the robot arm 212 of the external transfer module 210 can either transport an unpurged reticle from the reticle inspection tool 220 to the reticle purging tool 230, or transport a purged reticle from the reticle purging tool 230 back to the reticle inspection tool 220.

Because the external transfer module 210 is assigned with these transportation paths P21-P25, the external transfer module 210 can automatedly transport an uninspected reticle from load port 120 of the lithography tool 100 to the reticle inspection tool 200 for performing an reticle inspection operation, and can automatedly transport the reticle from the reticle inspection tool 220 to the reticle purging tool 230 for performing an reticle purging operation in response to the inspection determines that the reticle image has an unacceptable particle condition (i.e., identified particles exceeding acceptable threshold). Therefore, reticle transportation, reticle inspection, and reticle purging can be automatedly achieved by using the stand-alone reticle inspection/purging tool 200, so that manual operations for reticle inspection and purging can be skipped. In some embodiments, the transfer module 210 further includes a robot controller 214 that is configured to trigger the robot arm 212 to move along one of the assigned transportation paths P21-P25, so as to achieve automated operations. In some embodiments, the robot controller 214 may include a processor, a central processing unit (CPU), a multi-processor, a distributed processing system, an application specific integrated circuit (ASIC), or the like.

Figure 2:
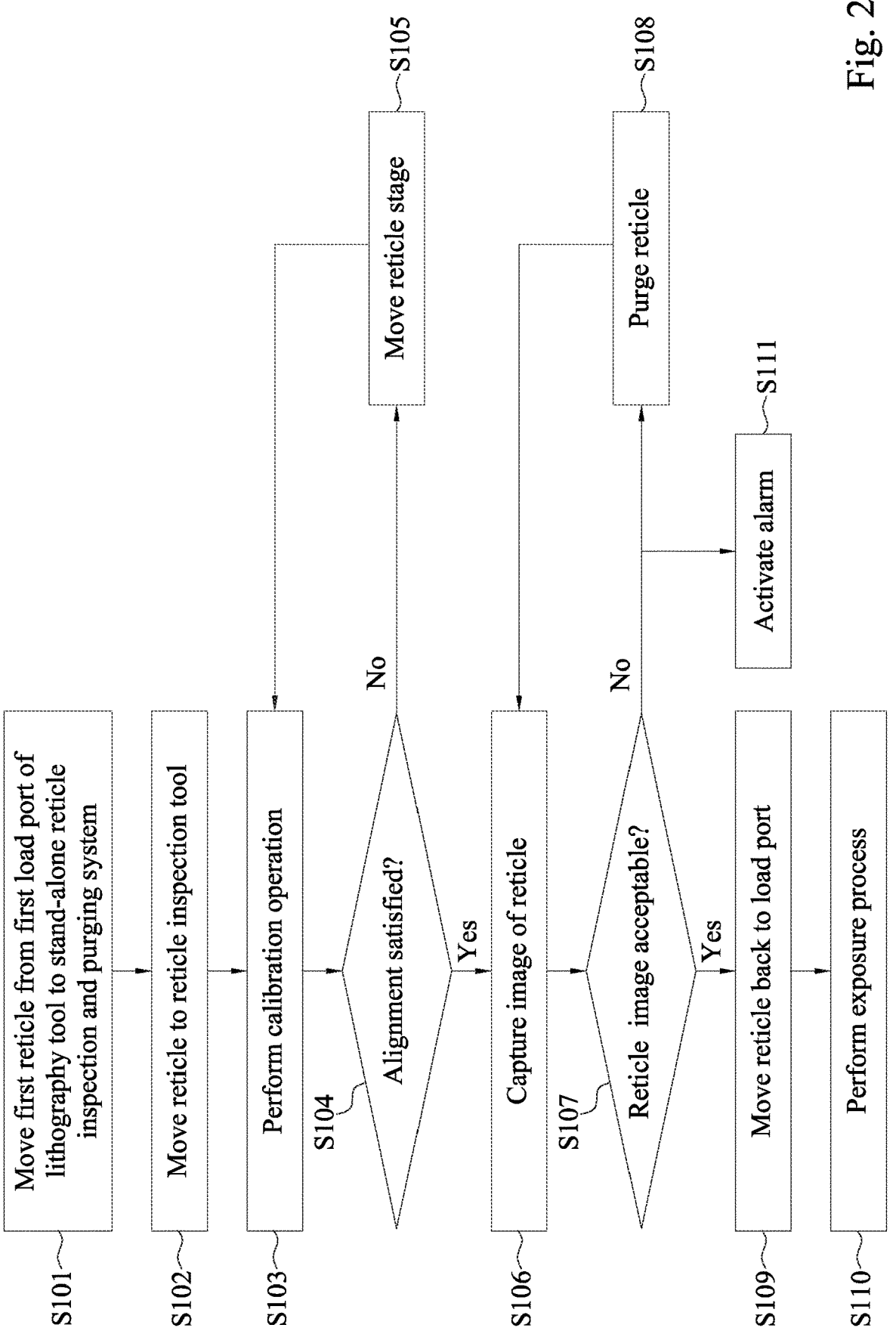
FIG. 2 is a flowchart of a reticle inspection and purging method in accordance with some embodiments.

FIG. 2 is a flowchart of a reticle inspection and purging method in accordance with some embodiments. The reticle inspection and purging method may be implemented in a fab for fabricating a semiconductor device on a wafer. It is understood that additional operations may be implemented before, during, and after the method illustrated in FIG. 2, and some of the operations may be replaced, eliminated, or moved around for additional embodiments of the method illustrated in FIG. 2. In block S101 in FIG. 2, a first reticle is moved from a first load port of a lithography tool to a stand-alone reticle inspection/purging tool. For example, as illustrated in FIG. 1, a reticle on first one of load ports 120 is transported from to the reticle inspection tool 220 by using the robot arm 212 of the external transfer module 210 along the transportation path P21.

Figure 3:
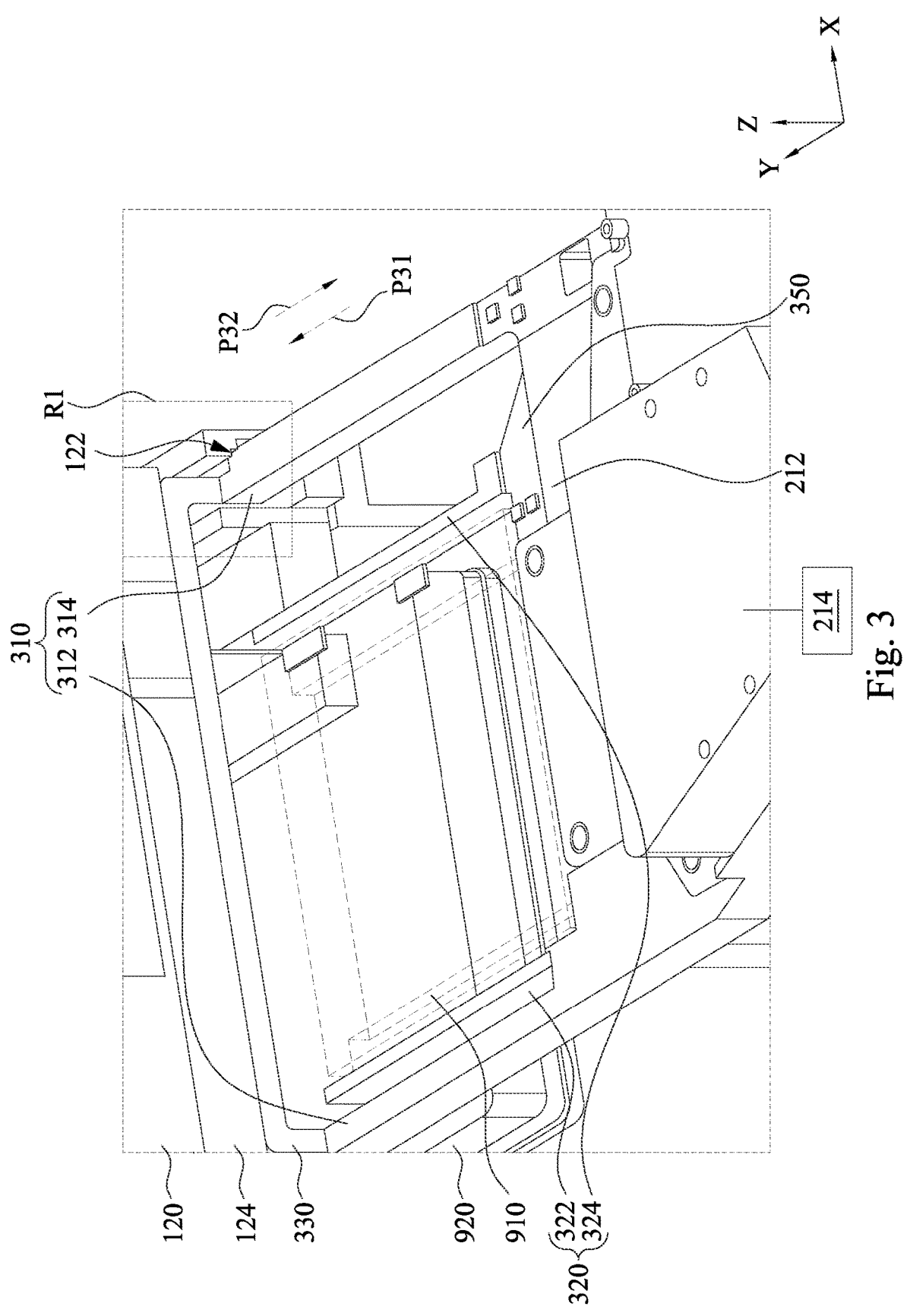
FIG. 3 is a perspective view illustrating a detailed example about the operation of block S101 of FIG. 2, in accordance with some embodiments of the present disclosure.

FIG. 3 illustrates a detailed example about the operation of block S101, in accordance with some embodiments of the present disclosure. As illustrated in FIG. 3, a robot arm 212 includes an outer fork 310, an inner fork 320, and an anti-collision bar 330 connecting a left prong 312 of the outer fork 310 and a right prong 314 of the outer fork 310. The anti-collision bar 330 has a top surface higher than top surfaces of left and right prongs 322, 324 of the inner fork 320, so as to prevent the reticle 910 from unwanted collision when the reticle 910 is held on the inner fork 320. In the operation of block S101, a reticle pod 920 placed on the load port 120 is opened by a pod opener mechanism in the load port 120, then the robot arm 212 moves along a path P31 toward a load port 120 until the inner fork 320 reaches an uninspected reticle 910 housed in the reticle pod 920, and then the robot arm 212 moves along a path P32 in a direction away from the load port 120 to take the uninspected reticle 910 away from the load port 120. The movement of the robot arm 212 is triggered by the robot controller 214. In some embodiments, the robot controller 214 is in electrical communication with the pod opener mechanism, and the robot controller 214 can be programmed in such a way that the robot controller triggers the movement in the path P31 after the reticle pod 920 is opened. In some embodiments, the outer fork 310 and the inner fork 320 are coated with a conformal coating (e.g., polytetrafluoroethylene (PTFE)) so as to reduce the risk of particle contamination.

In some embodiments, the right prong 314 of the outer fork 310 serves as a safety bar to confine X-directional relative position between the robot arm 212 and the load port 120. In greater detail, when the safety bar 314 moves alone with the robot arm 212 along the path P31 in Y-direction, the safety bar 314 slides into a confining slot 122 in the load port 120 that extends in Y-direction. The confining slot 122 has a Y-directional inner sidewall abutting a Y-directional sidewall of the safety bar 314, thus confining movement of the safety bar 314 in X-direction. In this way, the cooperation of the safety bar 314 and the confining slot 122 aids in confining the X-directional relative position between the robot arm 212 and the load port 120, thus preventing unwanted collision between the robot arm 212 and the load port 120 in X-direction.

In some embodiments, the anti-collision bar 330 serves to confine Z-directional relative position between the robot arm 212 and the load port 120. In greater detail, when the anti-collision bar 330 moves alone with the robot arm 212 along the path P31 in Y-direction, the anti-collision bar 330 slides to below an upper portion 124 of the load port 120. The anti-collision bar 330 has a top surface in X-Y plane, and the upper portion 124 of the load port 120 has a bottom surface in X-Y plane abutting the top surface of the anti-collision bar 330, which in turn confines movement of the anti-collision bar 330 in Z-direction. In this way, the cooperation of the anti-collision bar 330 and the upper portion 124 of the load port 120 aids in confining the Z-directional relative position between the robot arm 212 and the load port 120, thus preventing unwanted collision between the robot arm 212 and the load port 120 in Z-direction.

Figure 4:
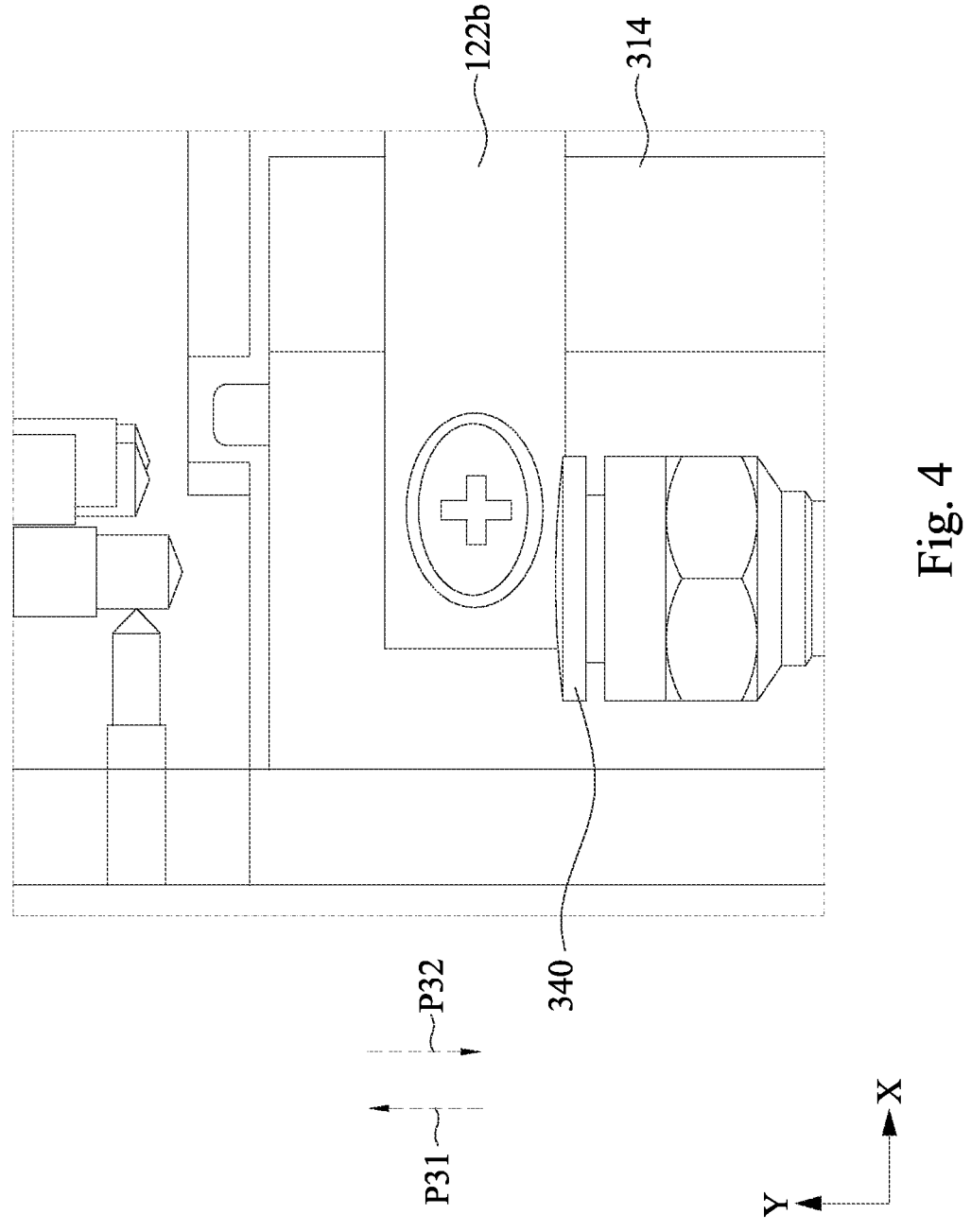
FIG. 4 illustrates an enlarged view of a partial region R1 of FIG. 3, in accordance with some embodiments of the present disclosure.

FIG. 4 illustrates an enlarged view of a partial region R1 of FIG. 3. In some embodiments, the robot arm 212 further includes a crash sensor 340 disposed on a distal region of the safety bar 314 that is situated away from a connecting plate 350 (shown in FIG. 3) connecting the inner fork 320 and the outer fork 310. The crash sensor 340 serves to stop the Y-directional movement of the robot arm 212 when the crash sensor 340 touches a deepest end 122b of the confining slot 122. In this way, the crash sensor 340 can prevent the robot arm 212 from colliding with an inner surface of the load port 120 during moving along the path P31 in Y-direction. In some embodiments, the crash sensor 340 is in electrical communication with the robot controller 214, and the robot controller 214 can be programmed in such a way that the robot controller 214 stops movement of the robot arm 212 once the crash sensor 340 detects collision occurs between the crash sensor 340 and the deepest end 122b of the confining slot 122.

Figure 5:
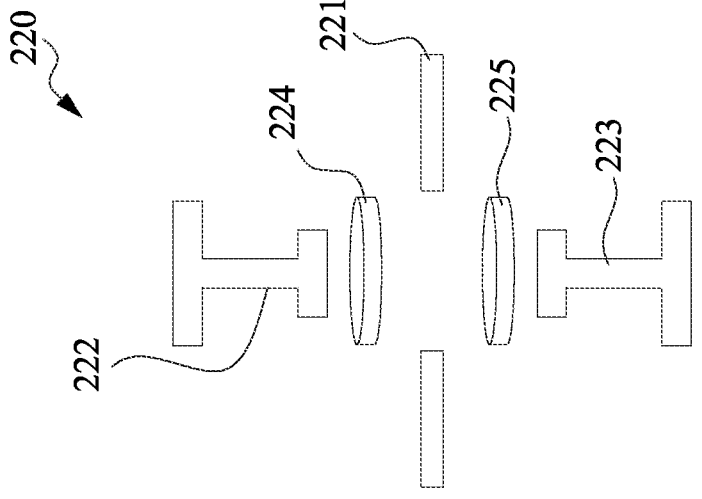
FIGS. 5-6 are side views illustrating steps of block S102 of FIG. 2, in accordance with some embodiments of the present disclosure.
Figure 5:
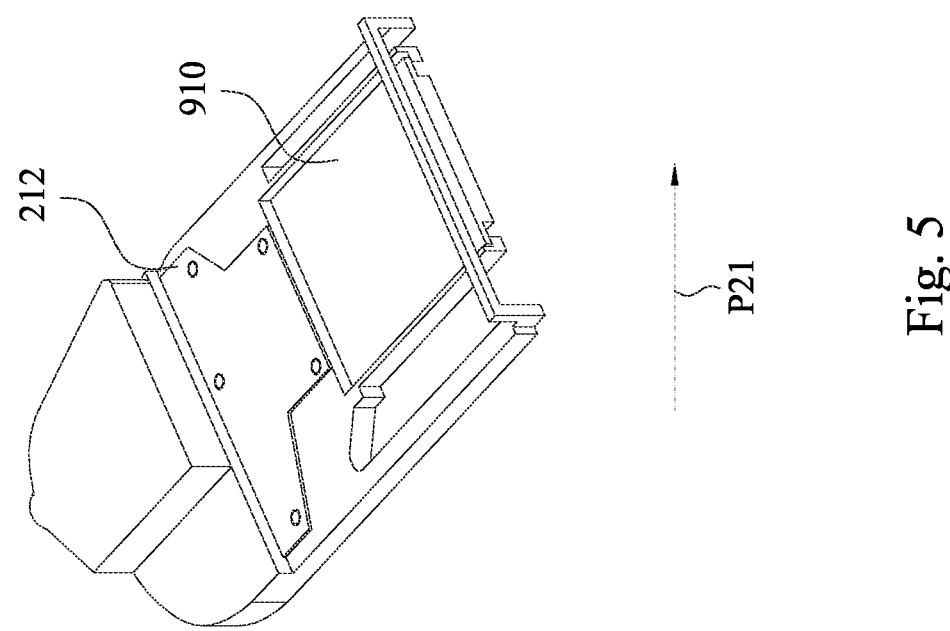
Figure 5:
Figure 6:
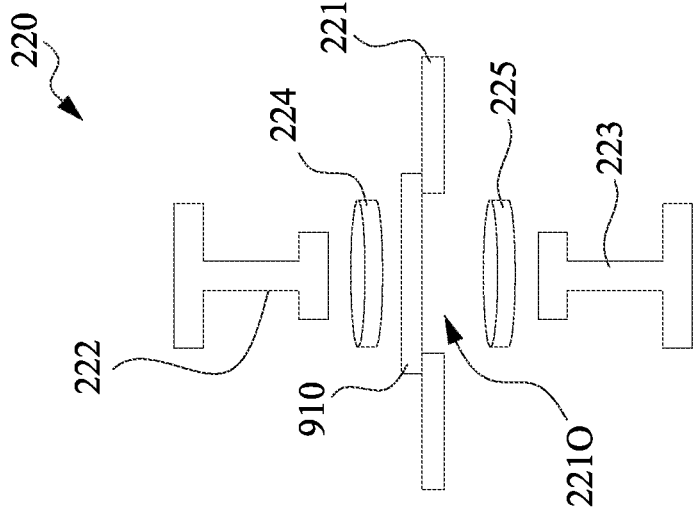
Figure 6:
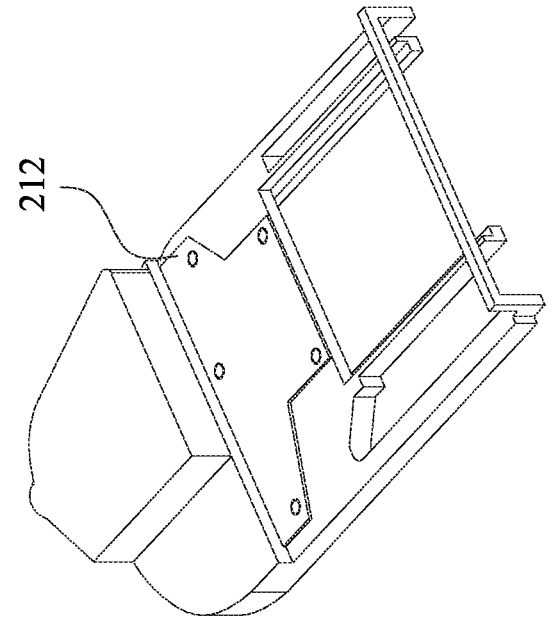
Figure 6:
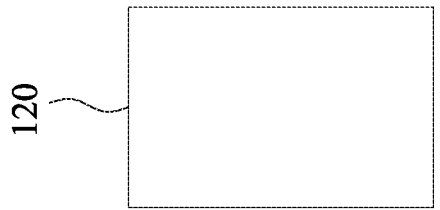

Referring back to FIG. 2, in block S102, the uninspected first reticle is moved to the reticle inspection tool. With reference to FIG. 5, in some embodiments, after the robot arm 212 taking the uninspected reticle 910 away from the load port 120, the robot arm 212 moves along the transportation path P21 from the load port 120 to the reticle inspection tool 220, until the robot arm 212 arrives at a movable reticle stage 221 of the reticle inspection tool 220. Next, the robot arm 212 places the uninspected reticle 910 onto the movable reticle stage 221, as illustrated in FIG. 6. In some embodiments, movable reticle stage 221 is a frame-shaped pedestal having a center opening 221O, and the uninspected reticle 910 is placed directly above the center opening 221O and supported by top surface of the frame-shaped pedestal.

Figure 7:
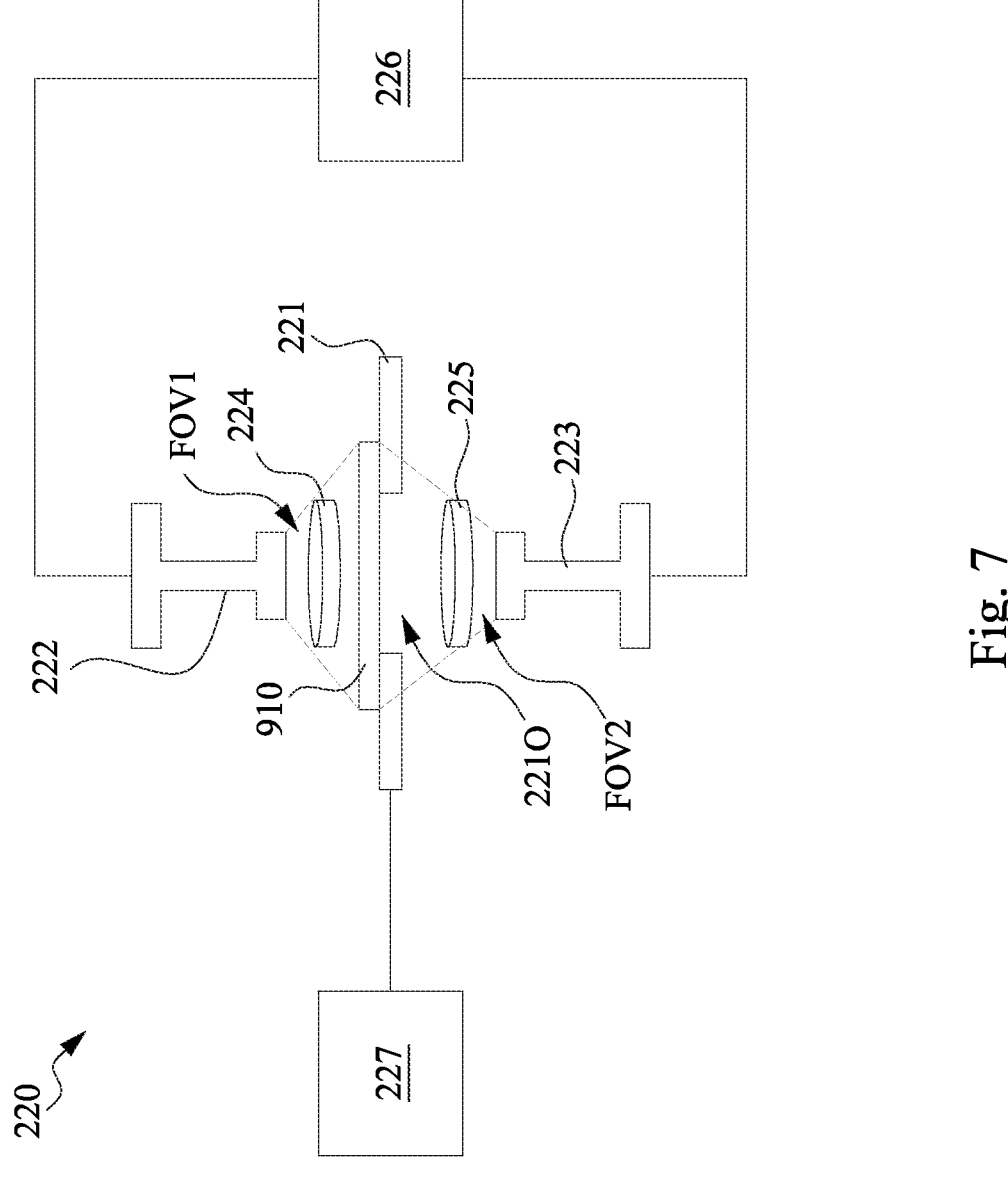
FIG. 7 is a side view illustrating a reticle inspection tool, in accordance with some embodiments of the present disclosure.

Next, in block S103, a calibration operation is performed to ensure accurate alignment between the uninspected reticle and one or more cameras of the movable reticle stage 221. Accuracy of the alignment is helpful in obtaining an accurate particle map in a subsequent reticle inspection operation. In some embodiments, as illustrated in FIG. 7, the reticle inspection tool 220 includes a top camera 222 above the movable reticle stage 221, a bottom camera 223 below the movable reticle stage 221, a top illuminator 224 between the top camera 222 and the movable reticle stage 221, and a bottom illuminator 225 between the bottom camera 223 and the movable reticle stage 221. The top camera 222 has a field of view FOV1 overlapping the center opening 221O of the reticle stage, so that the uninspected reticle 910 can be placed within the field of view FOV1 of the top camera 222 when the uninspected reticle 910 is transported onto the movable reticle stage 221. Similarly, the bottom camera 223 has a field of view FOV2 overlapping the center opening 221O of the reticle stage 221, so that the uninspected reticle 910 can be placed within the field of view FOV2 of the bottom camera 223 when the uninspected reticle 910 is transported onto the movable reticle stage 221. In this way, the top camera 222 serves to capture a top-view image of the reticle 910, and the bottom camera 223 serves to capture a bottom-view image of the reticle 910. The top illuminator 224 has a ring-shaped light source surrounding a light permeable circular region that allows for the top camera 222 collects images below the top illuminator 224. Similarly, the bottom illuminator 225 has a ring-shaped light source surrounding a light permeable circular region that allows for the bottom camera 223 collects images above the top illuminator 224.

One or both of the captured top-view reticle image and the captured bottom-view reticle image can be analyzed by an image analyzer 226, and the analysis result from the image analyzer 226 can be used to determine whether the reticle 910 is in an expected horizontal position, an expected vertical position, and/or an expected orientation suitable for the subsequent reticle inspection operation. In some embodiments, the image analyzer 226 may include a processor, a central processing unit (CPU), a multi-processor, a distributed processing system, an application specific integrated circuit (ASIC), or the like.

Figure 8:
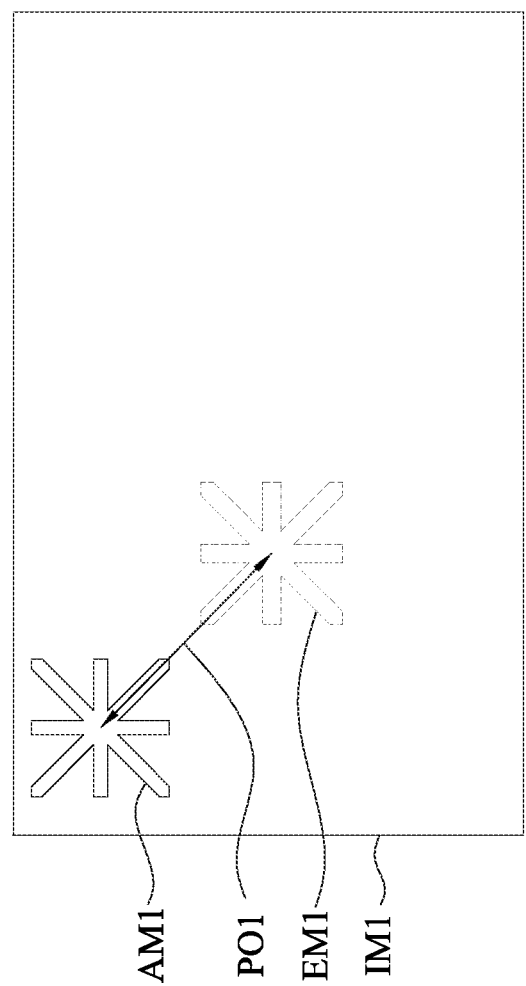
FIG. 8 illustrates an example top-view reticle image before horizontal position calibration, in accordance with some embodiments of the present disclosure.

In some embodiments, the calibration operation includes a horizontal position calibration operation. For example, FIG. 8 illustrates an example top-view reticle image IM1 captured by the top camera 222. The top-view reticle image IM1 has an alignment mark AM1. Once the image analyzer 226 receives the top-view reticle image IM1 from the top camera 222, the image analyzer 226 will perform the block S104 of the method in FIG. 2 to check whether the horizontal alignment between the reticle and cameras is satisfied. In particular, the image analyzer 226 compares a position of the alignment mark AM1 in the top-view reticle image IM1 with a position of an expected alignment mark EM1 stored in the image analyzer 226, and then generates a horizontal position offset PO1 from a center of the alignment mark AM1 to a center of the expected alignment mark EM1. In the illustrated embodiments, the alignment mark resembles a "*" pattern. In some embodiments, the alignment mark can be a L-shaped pattern, cross-shaped pattern, square pattern, or any other suitable pattern.

Figure 9:
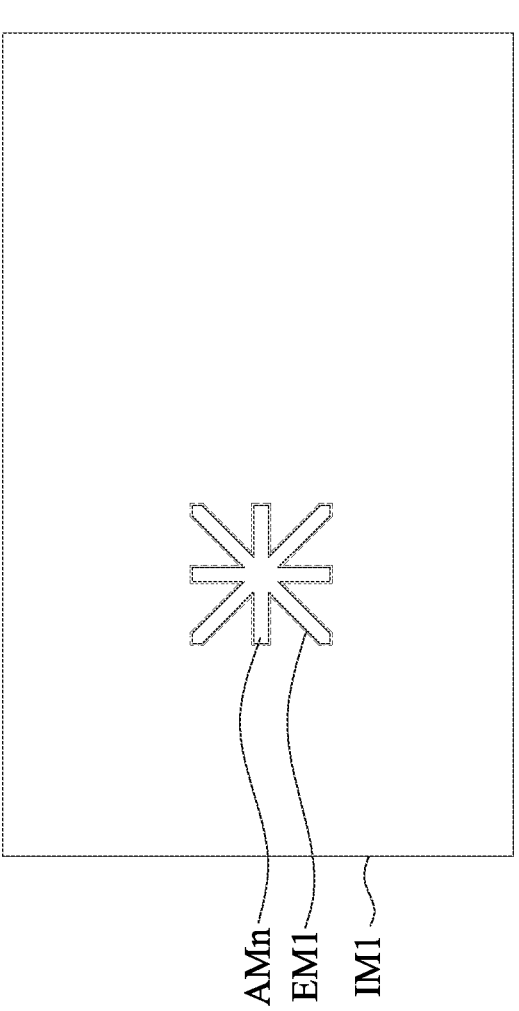
FIG. 9 illustrates an example top-view reticle image after horizontal position calibration, in accordance with some embodiments of the present disclosure.

Next, the horizontal position offset PO1 is fed back to a reticle stage actuator 227. The reticle stage actuator 227 is configured to actuate the reticle stage 221 to translate in a horizontal plane, vertically move up or down, rotate in the horizontal plane, and/or tilt with respect to the horizontal plane. Once the reticle stage actuator 227 receives the horizontal position offset PO1, the reticle stage actuator 227 will actuate the reticle stage 221 to translate in a horizontal plane in response to the horizontal position offset PO1. This step corresponds to block S105 in the method of FIG. 2. The method then loops back to block S103 to perform the horizontal position calibration again. If in block S104 the horizontal alignment is still unsatisfied (i.e., analysis result showing a non-zero horizontal position offset PO1 again), the method then proceeds to block S105 by moving the reticle stage 221 again. Blocks S103, S104, and S105 for horizontal position alignment may be a cyclic process repeated until in the latest performed block S104 the image analyzer 226 determines that the horizontal position offset PO1 is substantially zero (i.e., a center of the alignment mark AMn in the latest top-view reticle image IMn overlapping a center of an expected alignment mark EM1 stored in the image analyzer 226, as illustrated in FIG. 9). Stated differently, once the image analyzer 226 determines that the center of the alignment mark in the latest top-view reticle image IMn is not offset from the center of an expected alignment mark EM1 stored in the image analyzer 226, the horizontal position calibration is completed.

In the illustrated embodiments, the horizontal position calibration is performed based on the top-view reticle images. However, in some other embodiments, the horizontal position calibration can also be performed based on bottom-view reticle images captured by the bottom camera. For example, once the image analyzer 226 receives the bottom-view reticle image from the bottom camera 223, the image analyzer 226 will perform the block S104 of the method in FIG. 2 to check whether the alignment between the reticle and cameras is satisfied. In particular, the image analyzer 226 compares a position of an alignment mark in the bottom-view reticle image with a position of an expected alignment mark stored in the image analyzer 226, and then generates a horizontal position offset from a center of the alignment mark to a center of the expected alignment mark. If the horizontal position offset is non-zero, the method proceeds to block S105 to actuate the reticle stage 221 to translate in a horizontal plane in response to the horizontal position offset. The method then loops back to block S103 to perform the horizontal position alignment again. If in block S104 the alignment is still unsatisfied (i.e., analysis result showing non-zero horizontal position offset in the bottom-view reticle image), the method then proceeds to block S105 by moving the reticle stage 221 again. Blocks S103, S104, and S105 for horizontal position alignment may be repeated until in the latest performed block S104 the image analyzer 226 determines that the horizontal position offset in the bottom-view reticle image is substantially zero (i.e., a center of the alignment mark in the latest bottom-view reticle image overlapping a center of an expected alignment mark stored in the image analyzer 226). Stated differently, once the image analyzer 226 determines that the center of the alignment mark in the latest bottom-view reticle image is not offset from the center of an expected alignment mark stored in the image analyzer 226, the horizontal position calibration is completed.

Figure 10:
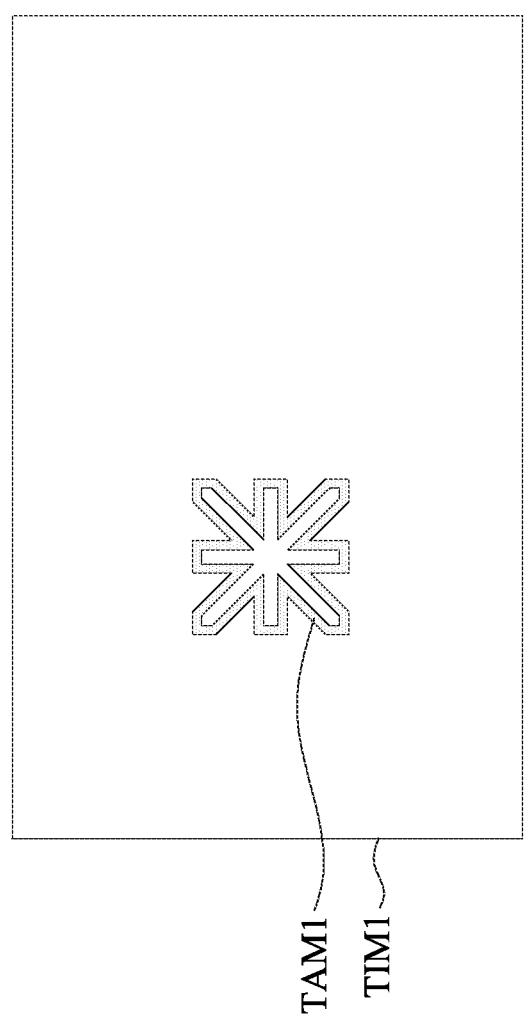
FIG. 10 illustrates an example top-view reticle image before vertical position calibration, in accordance with some embodiments of the present disclosure.
Figure 11:
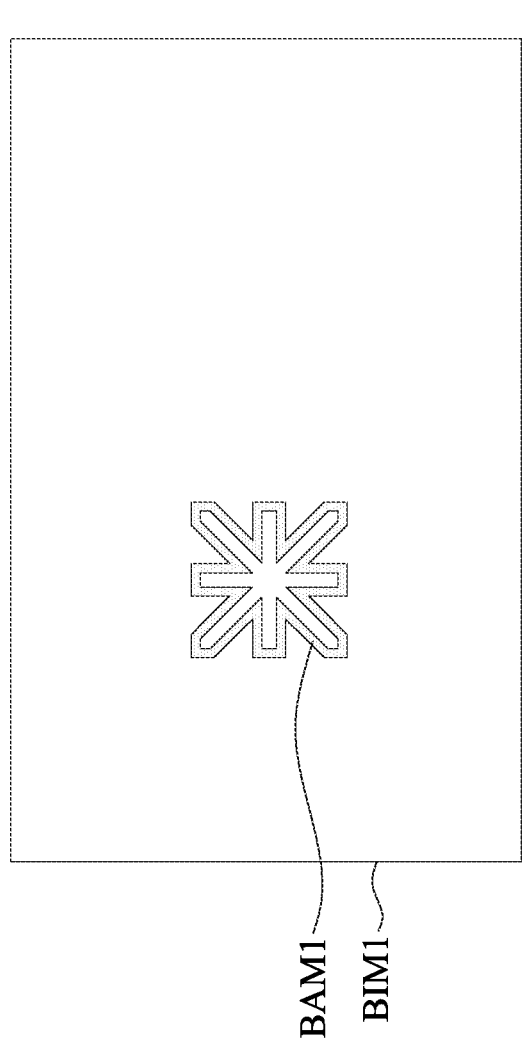
FIG. 11 illustrates an example bottom-view reticle image before vertical position calibration, in accordance with some embodiments of the present disclosure.

In some embodiments, the calibration operation includes a vertical position calibration operation. The vertical position calibration operation is performed by determining whether one or both of the top-view reticle image and the bottom-view reticle image is out-of-focus. For example, FIG. 10 illustrates an example top-view reticle image TIM1 captured by the top camera 222, and FIG. 11 illustrates an example bottom-view reticle image BIM1 captured by the bottom camera 223. The top-view reticle image TIM1 has an out-of-focus alignment mark TAM1, and the bottom-view reticle image BIM1 has an out-of-focus alignment mark BAM1. Once the image analyzer receives the top-view reticle image TIM1 and the bottom-view reticle image BIM1, the image analyzer will perform block S104 of the method in FIG. 2 to check whether the vertical alignment between the reticle and cameras is satisfied. In particular, the image analyzer 226 may calculate a vertical position offset between the current vertical position of the reticle 910 and an expected vertical position for the reticle 910, based on one or both of the out-of-focus alignment marks TAM1 and BAM1.

Figure 12:
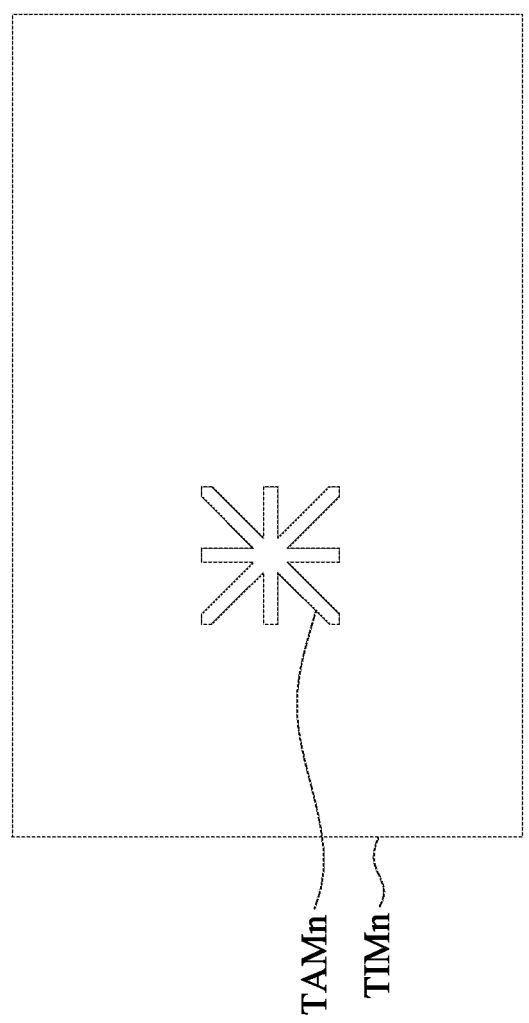
FIG. 12 illustrates an example top-view reticle image after vertical position calibration, in accordance with some embodiments of the present disclosure.
Figure 13:
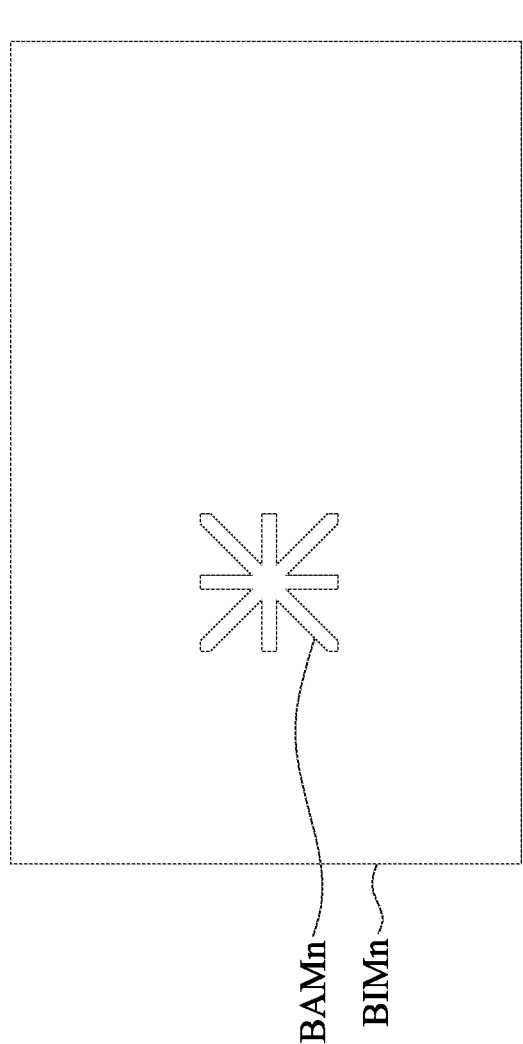
FIG. 13 illustrates an example bottom-view reticle image after vertical position calibration, in accordance with some embodiments of the present disclosure.

Next, the vertical position offset is fed back to the reticle stage actuator 227. Once the reticle stage actuator 227 receives the vertical position offset, the reticle stage actuator 227 will actuate the reticle stage 221 to move up or down in response to the vertical position offset. This step corresponds to block S105 in the method of FIG. 2. The method then loops back to block S103 to perform the vertical position calibration again. If in block S104 the alignment is still unsatisfied (i.e., analysis result showing a non-zero vertical position offset again), the method then proceeds to block S105 by lifting or lower the reticle stage 221 again. Blocks S103, S104, and S105 for vertical position calibration may be a cyclic process repeated until in the latest performed block S104 the image analyzer 226 determines that the vertical position offset is substantially zero (i.e., the alignment mark TAMn in the latest top-view reticle image TIMn being in-focus, and the alignment mark BAMn in the latest bottom-view reticle image BIMn being in-focus, as illustrated in FIGS. 12-13).

Figure 14:
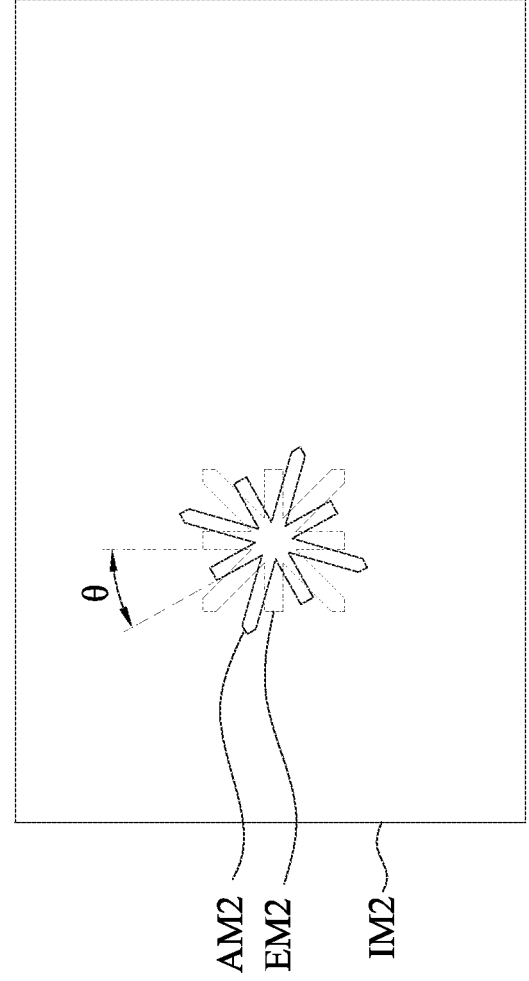
FIG. 14 illustrates an example top-view reticle image before orientation calibration, in accordance with some embodiments of the present disclosure.

In some embodiments, the calibration operation includes an orientation calibration operation. For example, FIG. 14 illustrates an example top-view reticle image IM2 captured by the top camera 222. The top-view reticle image IM2 has an alignment mark AM2. Once the image analyzer 226 receives the top-view reticle image IM2 from the top camera 222, the image analyzer 226 will perform the block S104 of the method in FIG. 2 to check whether the orientation alignment between the reticle and cameras is satisfied. In particular, the image analyzer 226 compares an angular position of the alignment mark AM2 in the top-view reticle image IM2 with an angular position of an expected alignment mark EM2 stored in the image analyzer 226, and then generates an angular offset θ between the alignment mark AM2 and the expected alignment mark EM2.

Figure 15:
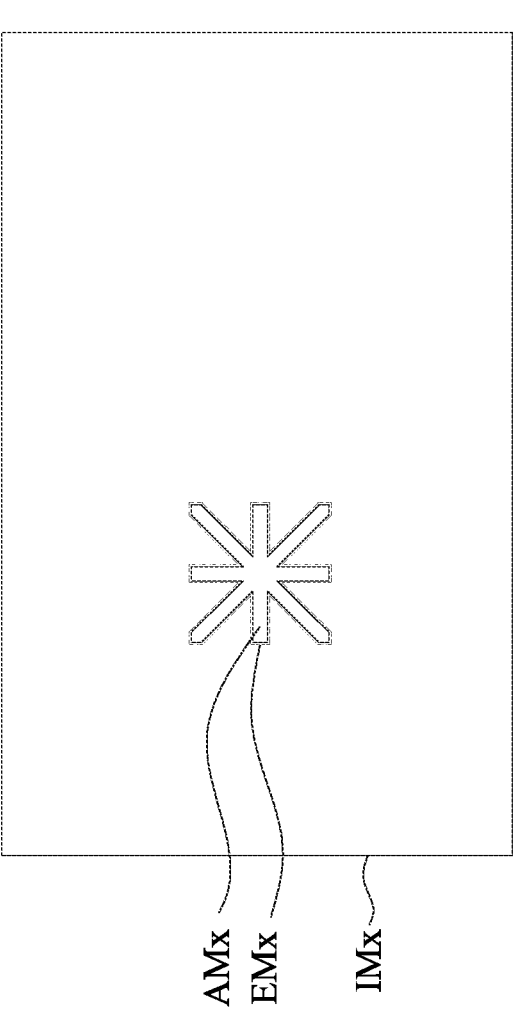
FIG. 15 illustrates an example top-view reticle image after orientation calibration, in accordance with some embodiments of the present disclosure.
Figure 16:
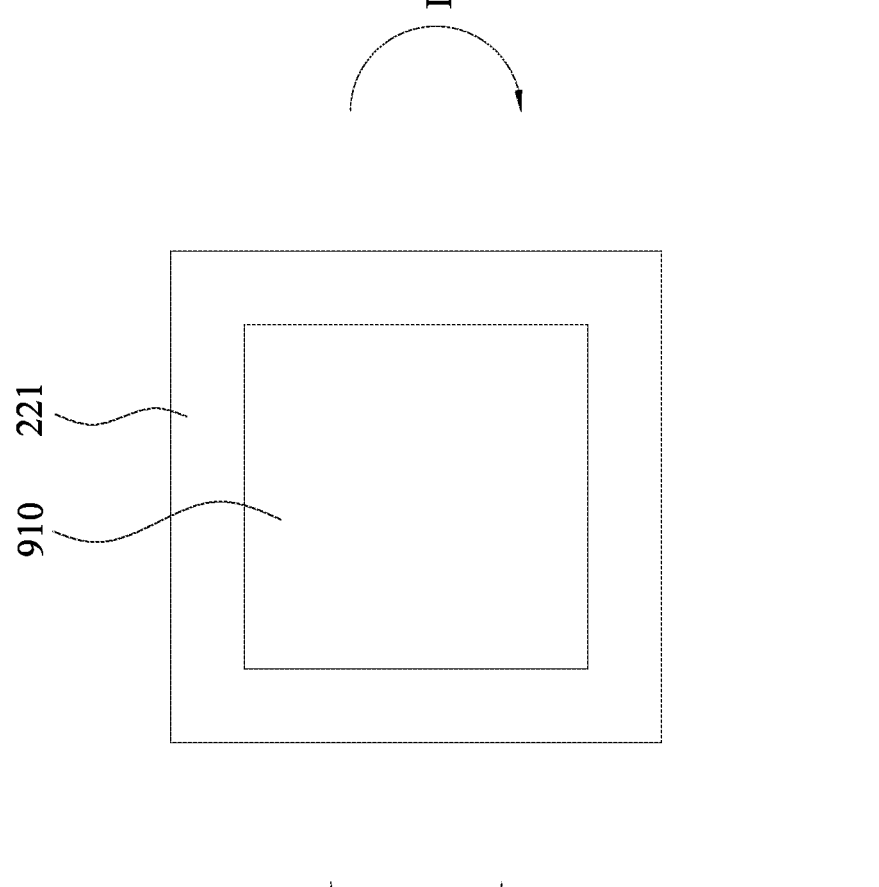
FIG. 16 is a plan view illustrating the orientation calibration operation, in accordance with some embodiments of the present disclosure.

Next, the angular offset is fed back to the reticle stage actuator 227. Once the reticle stage actuator 227 receives the angular offset, the reticle stage actuator 227 will actuate the reticle stage 221 to rotate in a clockwise direction D1 or in counterclockwise direction D2 in response to the angular offset, as illustrated in FIG. 16. This step corresponds to block S105 in the method of FIG. 2. The method then loops back to block S103 to perform the orientation calibration again. If in block S104 the alignment is still unsatisfied (i.e., analysis result showing a non-zero angular offset again), the method then proceeds to block S105 by rotating the reticle stage 221 in a clockwise or counterclockwise direction again. Blocks S103, S104, and S105 for orientation alignment may be a cyclic process repeated until in the latest performed block S104 the image analyzer 226 determines that the angular offset is substantially zero (i.e., no angular offset between the alignment mark AMx in the latest top-view reticle image IMx and the expected alignment mark EMx stored in the image analyzer 226, as illustrated in FIG. 15).

In the illustrated embodiments, the orientation calibration is performed based on the top-view reticle images. However, in some other embodiments, the orientation calibration can also be performed based on bottom-view reticle images captured by the bottom camera. For example, once the image analyzer 226 receives the bottom-view reticle image from the bottom camera 223, the image analyzer 226 will perform the block S104 of the method in FIG. 2 to check whether the orientation alignment between the reticle and cameras is satisfied. In particular, the image analyzer 226 compares an angular position of an alignment mark in the bottom-view reticle image with an angular position of an expected alignment mark stored in the image analyzer 226, and then generates an angular offset between the captured alignment mark and the expected alignment mark. If the angular offset is non-zero, the method proceeds to block S105 to actuate the reticle stage 221 to rotate in a horizontal plane in response to the angular offset. The method then loops back to block S103 to perform the orientation calibration again. If in block S104 the alignment is still unsatisfied (i.e., analysis result showing non-zero angular offset in the bottom-view reticle image), the method then proceeds to block S105 by rotating the reticle stage 221 again. Blocks S103, S104, and S105 for orientation calibration may be repeated until in the latest performed block S104 the image analyzer 226 determines that the angular offset in the bottom-view reticle image is substantially zero.

FIG. 17 is a flow chart illustrating an example calibration operation according to some embodiments of the present disclosure. In block S201, a first calibration operation is performed, wherein the first calibration operation is a first one of horizontal position calibration, vertical position calibration, and orientation calibration. For example, the first calibration operation is the horizontal position calibration. Next, in block S202, the image analyzer 226 will check whether the first one of horizontal position alignment, vertical position alignment, and orientation alignment is satisfied. If in block S202 the first alignment is unsatisfied, the method then proceeds to block S203 to move the reticle stage in response to the unsatisfied first alignment. For example, if the first alignment is the horizontal position alignment, the block S202 includes actuating the reticle stage 221 to perform horizontal translation; if the first alignment is the vertical position alignment, the block S202 includes actuating the reticle stage 221 to vertically move up or down; and if the first alignment is the orientation alignment, the block S202 includes actuating the reticle stage 221 to rotate in a clockwise or counterclockwise direction. Blocks S201, S202, and S203 may be a cyclic process repeated until in the latest performed block S202 the image analyzer 226 determines that the first alignment is satisfied.

Once the first alignment is satisfied, the method proceeds to block S204 to perform a second calibration operation, wherein the second calibration operation is a second one of horizontal position calibration, vertical position calibration, and orientation calibration. For example, the second calibration operation is the vertical position calibration. Next, in block S205, the image analyzer 226 will check whether the second one of horizontal position alignment, vertical position alignment, and orientation alignment is satisfied. If in block S205 the second alignment is unsatisfied, the method then proceeds to block S206 to move the reticle stage in response to the unsatisfied second alignment. For example, if the second alignment is the vertical position alignment, the block S206 includes actuating the reticle stage 221 to move up or down; if the second alignment is the horizontal position alignment, the block S206 includes actuating the reticle stage 221 to perform horizontal translation; and if the second alignment is the orientation alignment, the block S206 includes actuating the reticle stage 221 to rotate in a clockwise or counterclockwise direction. Blocks S204, S205, and S206 may be a cyclic process repeated until in the latest performed block S205 the image analyzer 226 determines that the second alignment is satisfied.

Once the second alignment is satisfied, the method proceeds to block S207 to perform a third calibration operation, wherein the third calibration operation is a third one of horizontal position calibration, vertical position calibration, and orientation calibration. For example, the third calibration operation is the orientation calibration. Next, in block S208, the image analyzer 226 will check whether the third one of horizontal position alignment, vertical position alignment, and orientation alignment is satisfied. If in block S208 the third alignment is unsatisfied, the method then proceeds to block S209 to move the reticle stage in response to the unsatisfied third alignment. For example, if the third alignment is the orientation alignment, the block S209 includes actuating the reticle stage 221 to rotate in a clockwise or counterclockwise direction; if the third alignment is the horizontal position alignment, the block S209 includes actuating the reticle stage 221 to perform horizontal translation; and if the third alignment is the vertical position alignment, the block S209 includes actuating the reticle stage 221 to move up or down. Blocks S207, S208, and S209 may be a cyclic process repeated until in the latest performed block S208 the image analyzer 226 determines that the third alignment is satisfied.

Referring back to FIG. 2, once all alignments are satisfied, the calibration is complete and the method proceeds to block S106. With reference to FIG. 7, in some embodiments of block S106, one or both of the top camera 222 and bottom camera 223 capture image(s) of the reticle 910 to perform the reticle inspection operation. For example, the reticle 910 can be scanned by using the top camera 222, and the resultant image can be collected by the top camera 222 and then analyzed by the image analyzer 226 to provide a particle map and images associated with suspected particle locations on the reticle 910. In this way, particles on the reticle 910 can automatedly identified. Stated differently, the reticle 910 can be automatedly inspected without manual operations.

Figures 18, 19, 20:
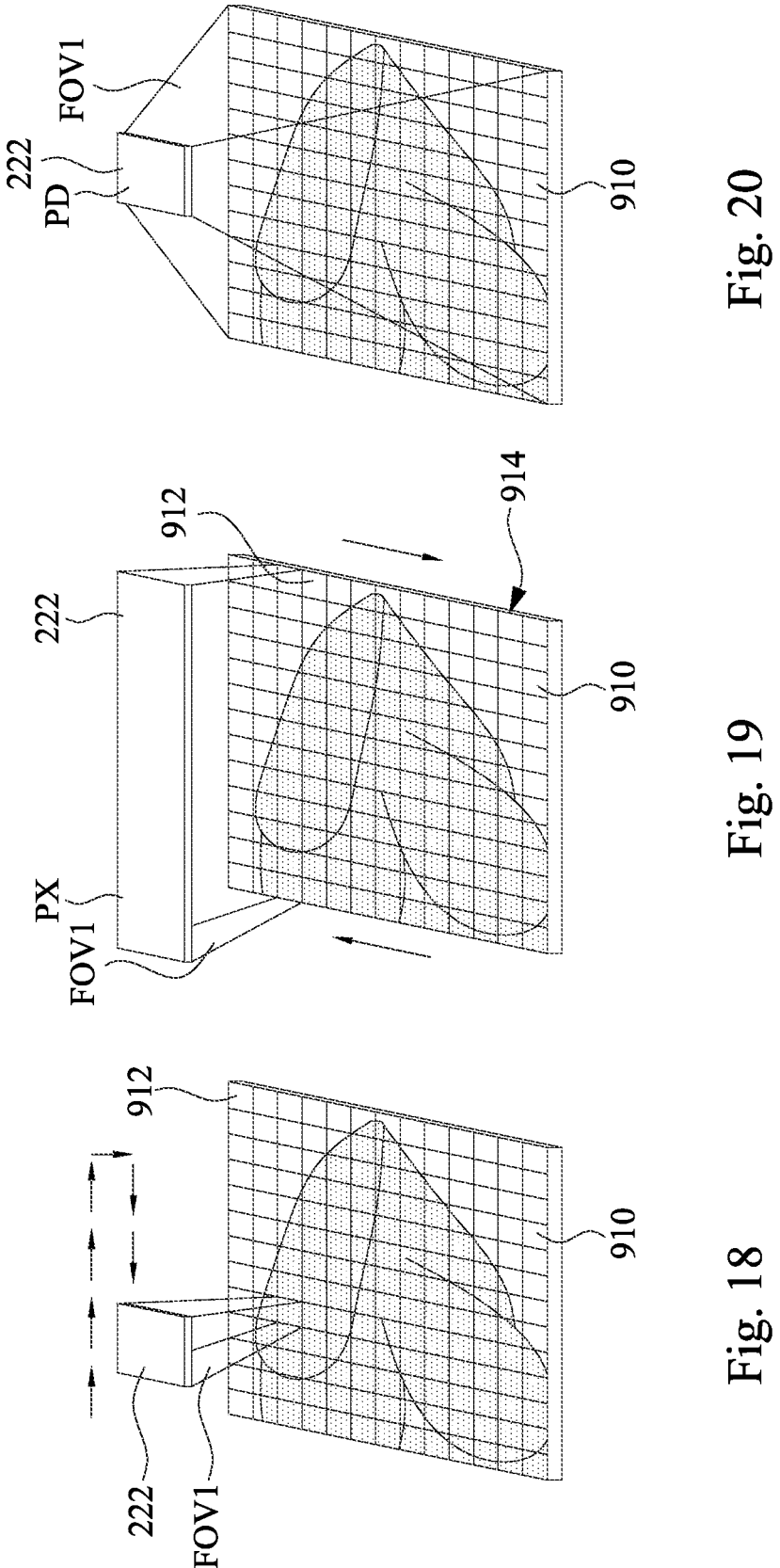
FIGS. 18-20 are perspective views illustrating various cameras in accordance with some embodiments of the present disclosure.

FIGS. 18-20 illustrate various cameras in accordance with some embodiments of the present disclosure. In FIG. 18, the top camera 222 is a single-pixel image sensor that scans across square local regions 912 of the reticle 910 in a one-by-one fashion. Each square local region 912 is a maximal recognizable area covered by the field of view FOV1 of the single-pixel image sensor 222. In FIG. 19, the top camera 222 is a linear pixel array consisting of a plurality of pixels PX arranged in a straight line. The linear pixel array 222 scans across strip-shaped local regions 914 each consisting of a plurality of square local regions 912 arranged in a straight line. Each strip-shaped local region 914 is a maximal recognizable area covered by the field of view FOV1 of the linear pixel array 222. In FIG. 20, the top camera 222 is a photodiode array consisting of a plurality of photodiodes PD arranged in an array of rows and columns. The photodiode array 222 may scan an entire reticle 910 simultaneously. Stated differently, the entire reticle 910 is a recognizable area covered by the field of view FOV1 of the photodiode array 222. In some embodiments, the bottom camera 223 may be a single-pixel image sensor as illustrated in FIG. 18, a linear pixel array as illustrated in FIG. 19, or a photodiode array as illustrated in FIG. 20.

In some embodiments, the photodiode array as illustrated in FIG. 20 has a greater resolution than the linear pixel array as illustrated in FIG. 19, and the linear pixel array has a greater resolution than the single-pixel image sensor as illustrated in FIG. 18. For example, a minimal recognizable particle size of the single-pixel image sensor is in a range from about 80 μm to about 100 μm, a minimal recognizable particle size of the linear pixel array is about 10 μm, and a minimal recognizable particle size of the photodiode array is about 3 μm. In some embodiments, the scanning speed of collecting an entire reticle image by using the photodiode array is faster than that using the linear pixel array, and the scanning speed of collecting an entire reticle image by using the linear pixel array is faster than that using the singe-pixel image sensor.

Referring back to FIG. 2, after the reticle image is captured by using one or both of the top camera and the bottom camera, the method proceeds to block S107. In block S107, the image analyzer 226 determines whether the reticle image has an acceptable particle condition. In some implementations, the image analyzer 226 may use a machine-learning model, which is trained based on historical big data, to determine whether the reticle image has an acceptable particle condition. For example, the machine-learning model may correlate historical lithographic defects (e.g., defect patterns in developed onto wafer) with identified particle sizes and/or counts in associated historical reticle images, and then generate an acceptable particle size threshold and/or an acceptable particle count threshold based on the machine-learning model.

Figure 21:
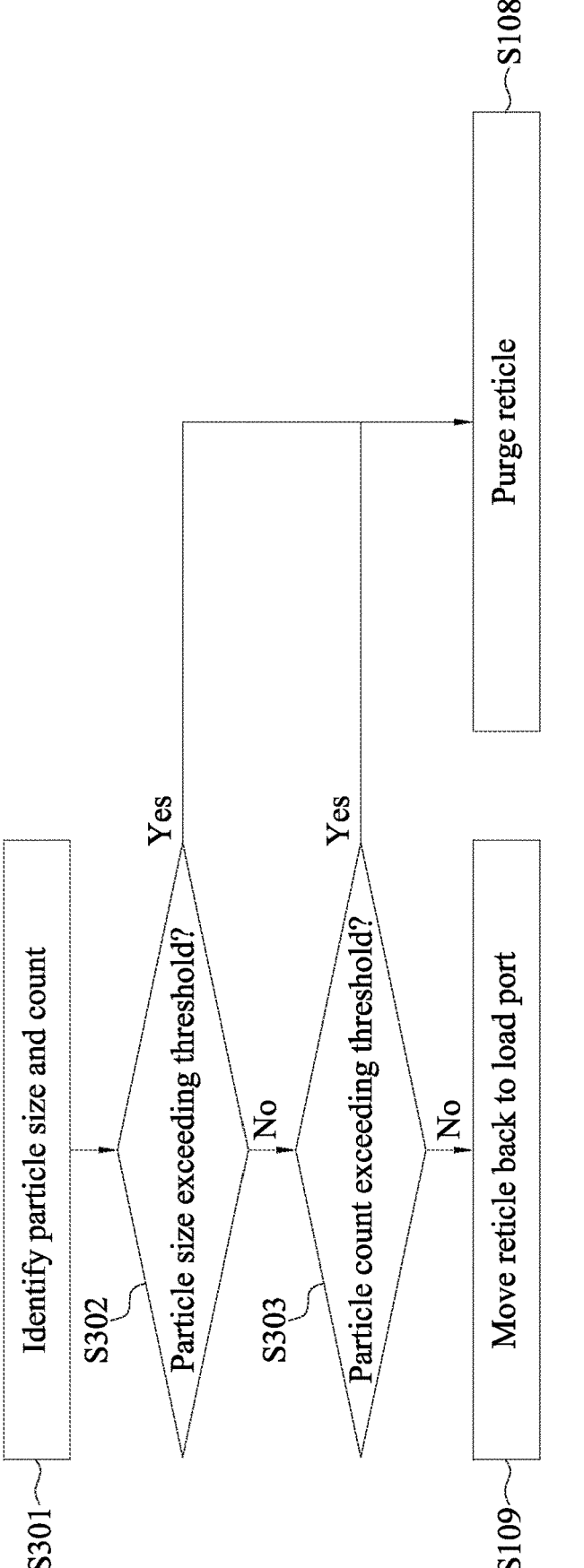
FIG. 21 is a flow chart illustrating an example analyzing method of determining whether the identified particles on the captured reticle images are acceptable, in accordance with some embodiments of the present disclosure.

FIG. 21 is a flow chart illustrating an example analyzing method of determining whether the identified particles on the captured reticle images are acceptable. In block S301, the image analyzer 226 may analyze the captured reticle image to recognize or identify particles in the captured reticle image, and then the image analyzer 226 can obtain particle sizes and particle count of the identified particles. In block S302, the image analyzer 226 determines whether a maximal identified particle size exceeds an acceptable particle size threshold generated based on a machine-learning model. When the determination determines that the maximal identified particle size exceeds the acceptable size threshold, the method proceeds to block S108 to purge the reticle, which will be discussed in greater detail below. When the determination determines that the maximal identified particle size does not exceed the acceptable size threshold, the method proceeds to block S303.

In block S303, the image analyzer 226 determines whether a maximal identified particle count exceeds an acceptable particle count threshold generated based on a machine-learning model. When the determination determines that the maximal identified particle count exceeds the acceptable count threshold, the method proceeds to block S108 to purge the reticle, which will be discussed in greater detail below. When the determination determines that the maximal identified particle count does not exceed the acceptable count threshold, the method proceeds to block S109 to transport the reticle 910 back to the first one of load ports 120. In some embodiments as illustrated in the flow chart of FIG. 21, the determination about particle size is performed before the determination about particle count. In some other embodiments, the determination about particle size is performed after the determination about particle count.

Figure 22:
FIG. 22 is a flow chart illustrating an example method for training an analysis model to generate an accurate particle size threshold and an accurate particle count threshold, in accordance with some embodiments of the present disclosure.

FIG. 22 is a flow chart illustrating an example method for training an analysis model, such as the model in the image analyzer 226, to generate an accurate particle size threshold and an accurate particle count threshold, in accordance with some embodiments of the present disclosure. In block S401, the training process gathers training set data including and historical lithographic defects, historic reticle images and historical classification data. This can be accomplished by using a data mining system or process. The data mining system or process can gather training set data by accessing one or more databases associated with the lithography tool 100 and reticle inspection/purging tool 200, and collecting data about lithographic defects and reticle images. The data mining system or process, or another system or process, can process and format the collected data in order to generate a training set data.

In block S402, the training process inputs historical reticle images and classification data to the analysis model of the image analyzer 226. In one example, this can include inputting historical reticle images into the analysis model. The historical reticle images can be provided in consecutive discrete sets to the analysis model of the image analyzer 226.

In block S403, the training process generates predicted classification data based on historical reticle images. In particular, the analysis model generates, for each set of historical reticle images, predicted classification data. The predicted classification data classifies each reticle image as representing either a clean reticle having an acceptable particle condition (i.e., reticle image having identified particle size and count both not exceeding acceptable thresholds) or an unclean reticle having an unacceptable particle condition (i.e., reticle having identified particle size and/or count exceeding acceptable thresholds), based on an estimated particle size threshold and/or an estimated particle count threshold.

In block S404, the predicted classification data is compared to the historical classification data. In particular, the predicted classification data for each set of historical reticle images is compared to the historical classification data associated with that set of historical reticle images. The comparison can result in an error function indicating how closely the predicted classification data matches the historical classification data. This comparison is performed for each set of predicted classification data. In some embodiments, this process can include generating an aggregated error function or indication indicating how the totality of the predicted classification data compares to the historical classification data. The comparisons can include other types of functions or data than those described above without departing from the scope of the present disclosure.

In block S405, the training process determines whether the predicted classification data matches the historical classification data based on the comparisons generated at block S404. In one example, if the aggregate error function is greater than an error tolerance, then the training process determines that the predicted classification data does not match the historical classification data. In some embodiments, if the aggregate error function is less than an error tolerance, then the training process determines that the predicted classification data does match the historical classification data.

In some embodiments, if the predicted classification data does not match the historical classification data at block S405, then the training process proceeds to block S406. At block S406, the training process adjusts the internal functions associated with the analysis model. In some embodiments, the internal functions include an estimated particle size threshold and an estimated particle count threshold. From the block S405, the process returns to block S402. At block S402, the historical reticle images are again provided to the analysis model. Because the internal functions (e.g., the estimated particle size threshold and the estimated particle count threshold) of the analysis model of the image analyzer 226 have been adjusted, the analysis model will generate different predicted classification data than in the previous cycle. The process proceeds to blocks S403, S404, and S405, and the aggregate error is calculated. If the predicted classification data does not match the historical classification data, then the process returns to block S406 and the internal functions of the analysis model of the image analyzer 226 are adjusted again. This cycle from block S402 to block S406 proceeds in iterations until the analysis model of the image analyzer 226 generates predicted classification data that matches the historical classification data.

In one embodiment, if the predicted classification data matches the historical classification data at block S405, then the training process proceeds to block S407. In block S407, training is complete, which means the analysis model of the image analyzer 226 is now ready to be utilized to detect whether a reticle requires a purging operation. Stated differently, the latest estimated particle size threshold can serve as the particle size threshold used in block S302 of the method of FIG. 21, and the latest estimated particle count threshold can serve as the particle count threshold used in block S303 of the method of FIG. 21.

Figure 23:
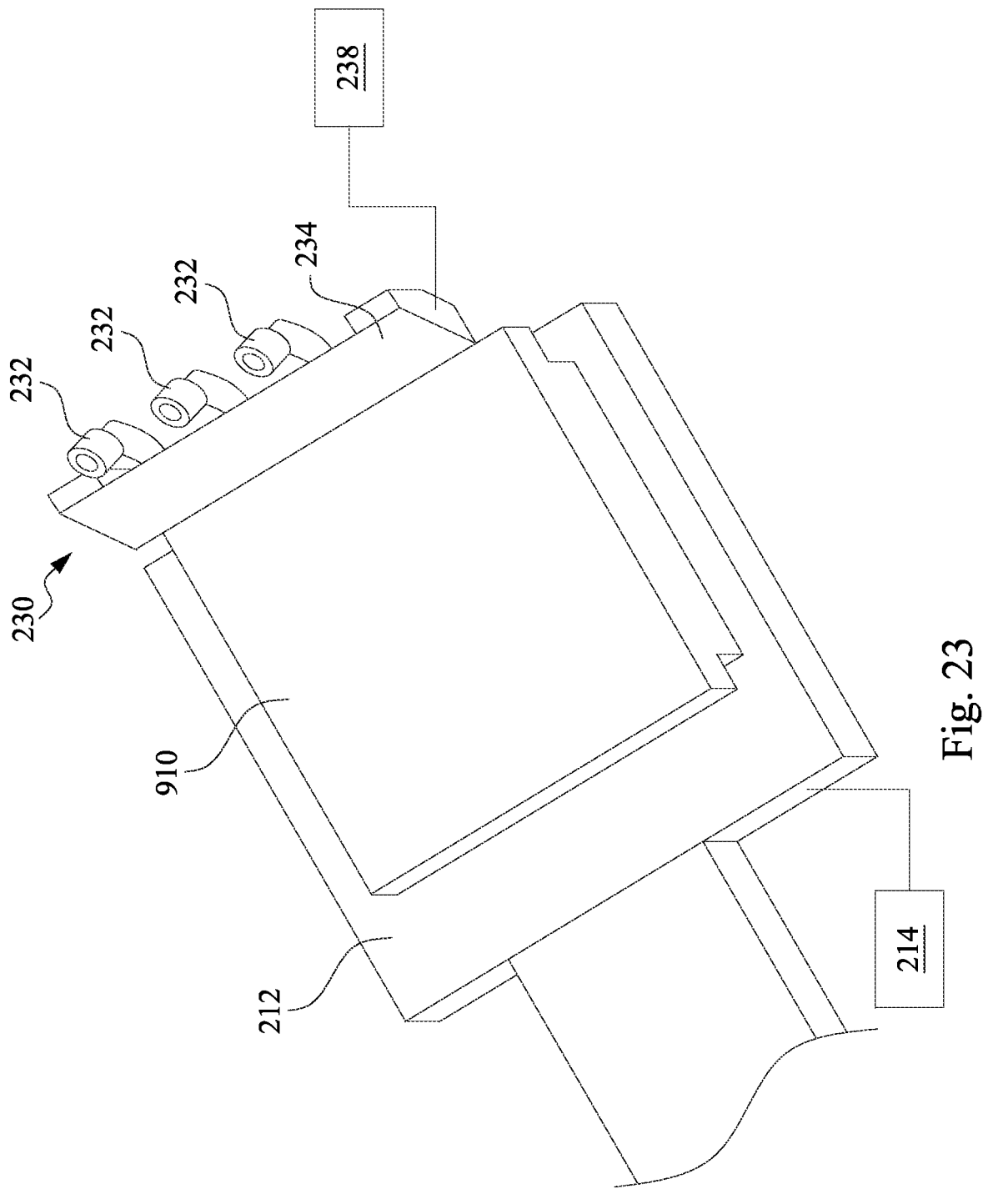
FIG. 23 illustrates a perspective view of a reticle purging tool according to some embodiments.
Figure 24:
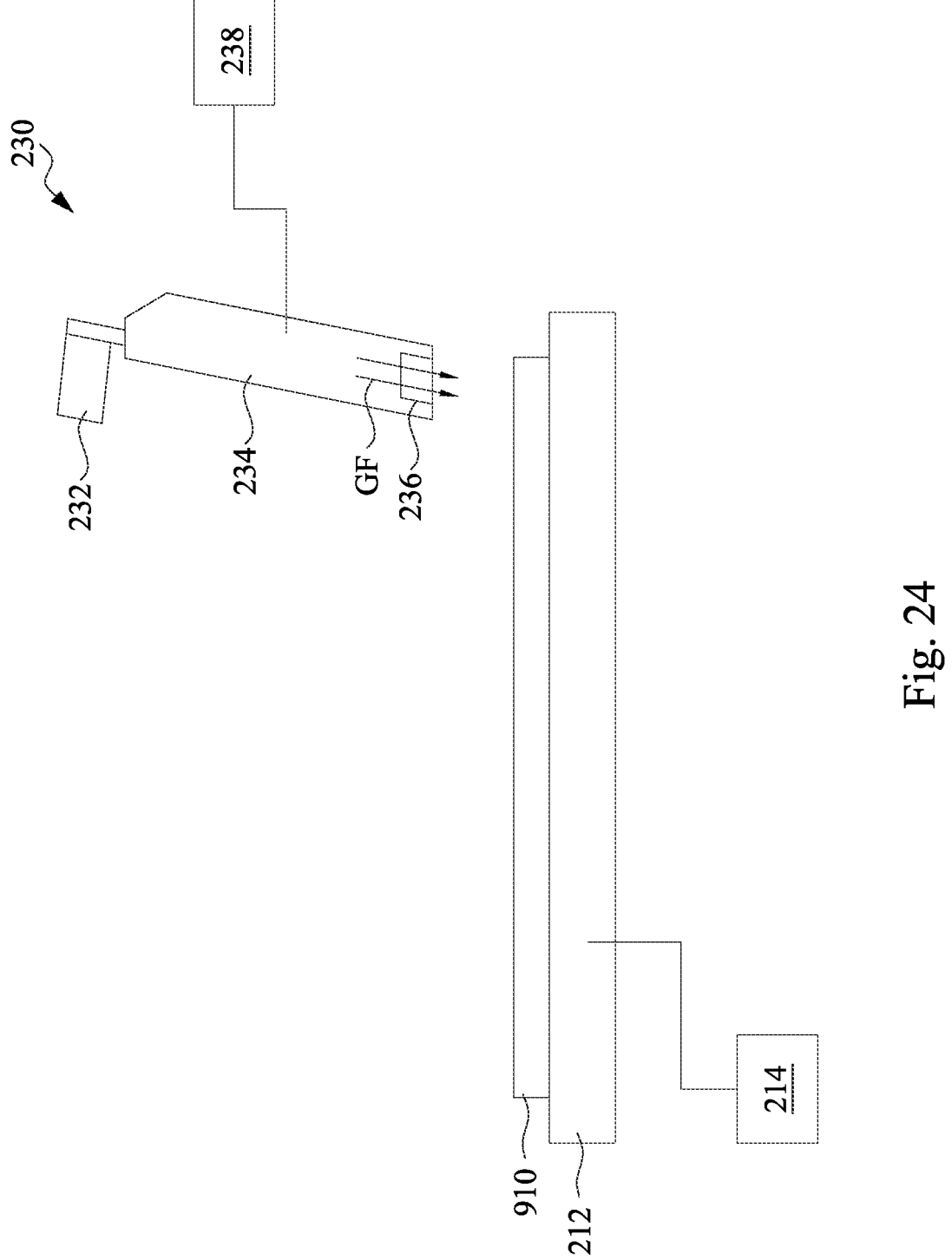
FIG. 24 illustrates a side view of a reticle purging tool according to some embodiments.

Referring back to FIG. 2, after the determination of block S107 determines that the reticle image has an unacceptable particle condition (i.e., identified particle size exceeding the particle size threshold and/or identified particle count exceeding the particle count threshold), the method proceeds to block S108. With reference to FIGS. 23 and 24, in some embodiments of block S108, the reticle 910 is purged by using the reticle purging tool 230. In particular, after the reticle 910 is determined as having an unacceptable particle condition, the robot arm 212 transports the reticle 910 from the reticle stage 221 of the reticle inspection tool 220 to the reticle purging tool 230. In some embodiments, this transportation is triggered by the robot controller 214. In some embodiments, the robot controller 214 is in electrical communication with the image analyzer 226, and the robot controller 214 can be programmed in such a way that the robot controller 214 triggers the movement from the reticle inspection tool 220 to the reticle purging tool 230 after the image analyzer 226 determines that the reticle 910 has an unacceptable particle condition.

FIG. 23 illustrates a perspective view of the reticle purging tool 230 according to some embodiments. FIG. 24 illustrates a side view of the reticle purging tool 230 according to some embodiments. As illustrated in FIGS. 23 and 24, the reticle purging tool 230 is an gas knife including a plurality of gas inlets 232, an gas knife chamber 234 downstream of the gas inlets 232, and a purging nozzle 236 downstream of the air knife chamber 234. The gas inlets 232 serve to receive a purging gas from a gas source through a manifold connecting the gas inlets 232 and the gas source. In some embodiments, the purging gas may be pressurized or compressed nitrogen gas or other suitable gas, such as inert gas, so as to prevent from the chemical reaction with the reticle 910. The purging gas is pumped into the gas knife chamber 234 through the gas inlets 232, and then a gas flow GF of the purging gas is ejected through the purging nozzle 236 to blow particles away from the reticle 910, thus achieving the reticle purging operation.

In some embodiments, the purging gas is pumped into the gas knife chamber 234 through multiple gas inlets 232. Based on a simulation result, the purging gas pumped though multiple gas inlets 232 produces a smaller turbulence in the gas knife chamber 234 than the purging gas pumped through a single gas inlet. A smaller turbulence in the gas knife chamber 234 allows for ejecting a faster gas flow through the purging nozzle 236. Therefore, the gas knife 230 having multiple gas inlets 232 can eject a faster gas flow than a gas knife having a single gas inlet, which in turn results in an improved purging result.

In some embodiments, the gas knife 230 is controlled by a purging tool controller 238. The purging controller 238 is in electrical communication with the image analyzer 226. The purging controller 238 can be programmed to activate the gas knife 230 after the image analyzer 226 determines that the reticle image has an unacceptable particle condition (i.e., particle size and/or particle count exceeding acceptable thresholds). In some embodiments, the purging controller 238 can optimize the purging gas flow GF by controlling various purging parameters, such as a blowing angle, a distance to reticle, and a gas flow rate of the gas inlets 232. Such optimization can maximize the blowing force to the reticle 910 and minimize the turbulence in the air knife chamber 234. In some embodiments, purging controller 238 may determine optimized purging parameters for the purging gas flow GM based on historical big data. For example, the purging controller 238 may use a machine-learning model to correlate historical purging results (i.e., images of purged reticles) with associated historical purging parameters, and then generate optimized purging parameters based on the machine-learning model. In some embodiments, the purging controller 238 may include a processor, a central processing unit (CPU), a multi-processor, a distributed processing system, an application specific integrated circuit (ASIC), or the like.

In some embodiments, the robot controller 214 can control the robot arm 212 to move to a destination where the identified particles can be blown by the gas knife 230. In particular, the destination is determined based on the particle map obtained from the captured reticle image, and motion of the robot arm 212 is controlled in such a way that the identified particles of the particle map can get closer to the purging nozzle 236 of the gas knife 230 when the robot arm 212 arrives at the destination.

Referring back to FIG. 2, after the reticle purging operation is completed, the method then loops back to block S106 to capture the image of purged reticle. This step is also called a re-scan process performed after the purging process. If in block S107 the reticle image still has an unacceptable particle condition (i.e., having particle size larger than threshold or particle count greater than threshold), the method then proceeds to block S108 to purge the reticle again. Blocks S106, S107, and S108 may form a cyclic operation repeated until in the latest performed block S107 the image analyzer 226 determines that the reticle image is acceptable (i.e., having particle size not exceeding threshold or particle count not exceeding threshold). Once the determination in block S107 determines that the reticle image is acceptable, the method proceeds to block S109. Next, in block S109, the purged reticle 910 is transported from the reticle inspection tool 220 back to the corresponding load port 120 by using the robot arm 212. In some embodiments, if the determination in block S107 determines that manual operation is required based on the reticle image, the method then proceeds to block S111. In block S111, an alarm is activated. For example, an alarm may be shown on the operator interface 240 to notify operators and/or engineers.

Figure 25:
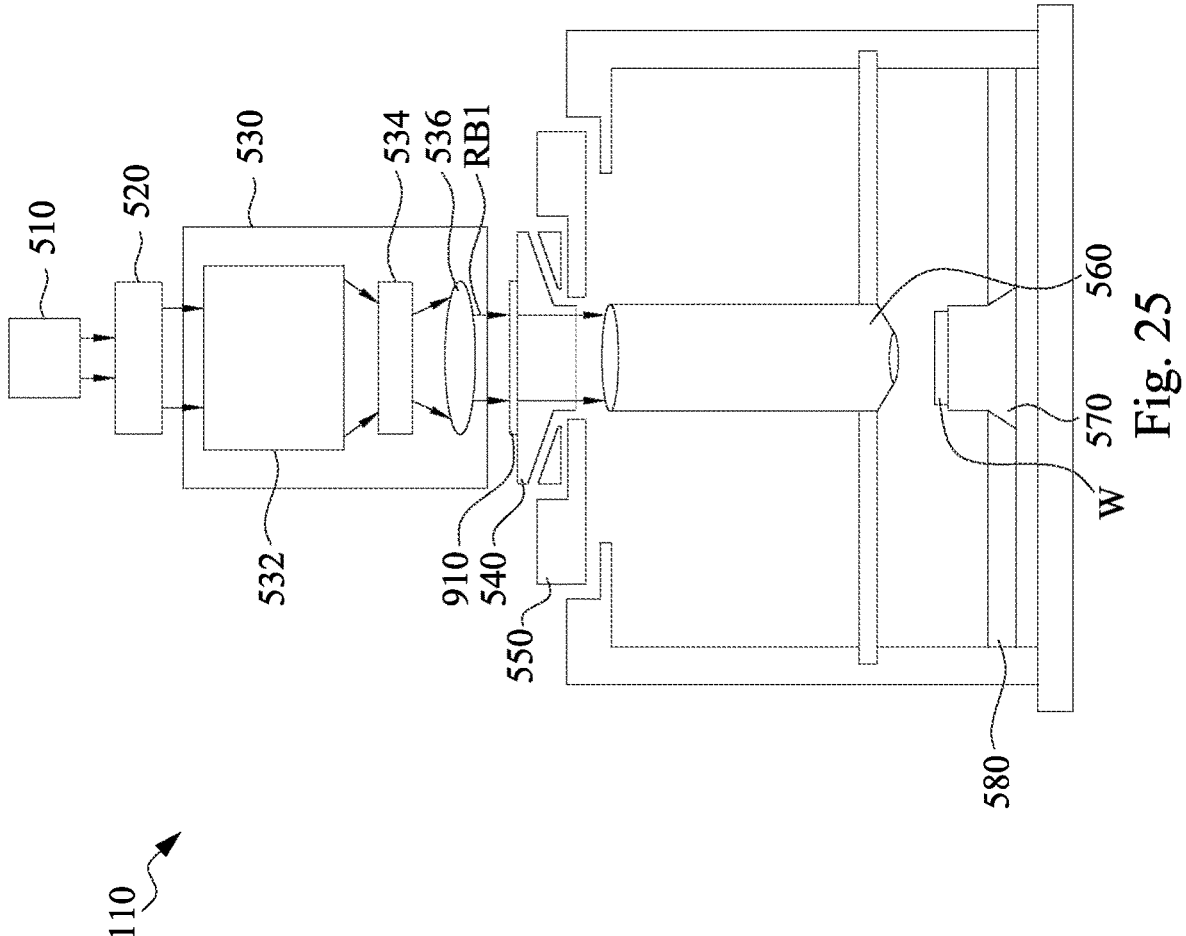
FIG. 25 is a side view illustrating an example exposure tool 110 in some embodiments of the present disclosure.

Next, in block S110, the inspected and purged reticle 910 is loaded into the exposure tool 110 by using the internal transfer module 140 within the lithography tool 100, and an exposure process is performed by the exposure tool 110 using the inspected and purged reticle 910. FIG. 25 illustrates an example exposure tool 110 in some embodiments of the present disclosure. The exposure tool 110 includes an illumination system (illuminator) 530 configured to condition a radiation beam RB1 (e.g., UV radiation or any other suitable radiation), a support structure (e.g., a reticle table) 540 constructed to support a reticle (e.g., an inspected and purged reticle 910) and connected to a first positioning device (also referred to as a photomask positioning device) 550 configured to accurately position the reticle 910 in accordance with certain parameters. The exposure tool 110 also includes a substrate table (e.g., a wafer table) 570 or "substrate support" constructed to hold a substrate (e.g., a resist-coated wafer) W and connected to a second positioning device (also referred to as a wafer positioning device) 580 configured to accurately position the substrate W in accordance with certain parameters. In some embodiments, the wafer table 570 can be referred to as a holding device because it can hold the wafer W. The exposure tool 110 further includes a projection system (e.g., a refractive projection lens system) 560 configured to project a pattern imparted to the radiation beam RB1 by reticle 910 onto a target region of the substrate W.

The support structure 540 supports, i.e., bears the weight of, the reticle 910. In some embodiments, the support structure 540 can use mechanical, vacuum, electrostatic or other clamping techniques to hold the reticle 910. The support structure 540 may be a frame or a table, for example, which may be fixed or movable. The support structure 540 may ensure that the reticle 910 is at a desired position, for example with respect to the projection system 560.

In some embodiments, the illuminator 530 receives a radiation beam RB1 from a radiation source 510. The radiation source and the lithographic apparatus may be separate entities, for example when the radiation source is an excimer laser. In such cases, the radiation source 510 is not considered to form part of the lithographic apparatus and the radiation beam RB1 is passed from the source 510 to the illuminator 530 with the aid of a beam delivery system 520 including, for example, suitable directing mirrors and/or a beam expander. In other cases, the radiation source 510 may be an integral part of the exposure tool, for example when the radiation source 510 is a mercury lamp. The source 510 and the illuminator 530, together with the optional beam delivery system 520, may be referred to as a radiation system.

In some embodiments, the illuminator 530 may include an adjuster 532 configured to adjust the angular intensity distribution of the radiation beam RB1. Generally, at least the outer and/or inner radial extent (commonly referred to as σ-outer and σ-inner, respectively) of the intensity distribution in a pupil plane of the illuminator 530 can be adjusted. In addition, the illuminator 530 may include various other components, such as an integrator 534 and a condenser 536. The illuminator 530 may be used to condition the radiation beam RB1, to have a desired uniformity and intensity distribution.

The radiation beam RB1 is incident on the reticle 910, which is held on the photomask positioning device 550, and is patterned by the reticle 910. Having traversed the reticle 910, the radiation beam RB1 passes through the projection system 560, which focuses the radiation beam RB1 onto a target region of the wafer W on the wafer table 570. With the aid of the wafer positioning device 580, the wafer table 570 can be moved accurately, e.g., so as to position different target portions of the wafer in the path of the radiation beam RB1. Similarly, the photomask positioning device 550 can be used to accurately position the reticle 910 with respect to the path of the radiation beam RB1, e.g., after loading the reticle 910 into the exposure tool 110, or during a scan. In general, movement of the reticle table 540 may be realized with the aid of a long-stroke module (coarse positioning) and a short-stroke module (fine positioning), which form part of the photomask positioning device 550. Similarly, movement of the wafer table 570 may be realized using the wafer positioning device 580. In the case of a stepper (as opposed to a scanner), the reticle table 540 may be connected to a short-stroke actuator only, or may be fixed. Reticle 910 on the reticle table 540 and the wafer W on the wafer table 570 may be aligned using photomask alignment marks on the reticle 910 and wafer alignment marks on the wafer W.

In some embodiments, during performing an exposure process in the exposure tool 110 using the inspected and purged reticle 910, an uninspected reticle placed on a second one of the load ports 120 can be transported to the stand-alone reticle inspection/purging tool 200, inspected and purged by using the stand-alone reticle inspection/purging tool 200. Thus, the exposure process will not stop because of inspecting and/or purging other reticles, which in turn will increase the lithography throughput.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the reticle can be inspected and purged by using a stand-alone external to the lithography tool, and thus the exposure process will not stop during the reticle inspection/purging operations, which in turn increase the lithography throughput. Another advantage is that the reticle is purged by an automated purging tool without manual operation, and thus potential contamination and/or unsteady purging gas flow resulting from manual operations can be reduced. Another advantage is that the external robot arm have multiple anti-collision designs (e.g., safety bar, anti-collision bar, and/or crash sensor), so as to prevent unwanted collision when taking a reticle away from a load port or moving the reticle back to the load port. Another advantage is that multiple calibration operations can be performed prior to the reticle inspection operation, which in turn improves accuracy of the reticle inspection result. Another advantage is that the cameras for reticle inspection have high resolution to identify small particles. Another advantage is that the reticle inspection tool has an image analyzer capable of automatically classifying and identifying "killing defects" (i.e., particle size and/or particle count exceeding acceptable threshold) based on historical big data.

In some embodiments, a method comprises moving a first reticle from a first load port of a lithography tool to a reticle inspection tool located outside the lithography tool; inspecting the first reticle using the reticle inspection tool located outside the lithography tool; determining whether the first reticle is acceptable for exposure based on the inspection result of inspecting the first reticle; and in response the determination determines that the first reticle is not acceptable for exposure, purging the first reticle. In some embodiments, the method further comprises moving a second reticle from a second load port of the lithography tool to an exposure tool and performing an exposure process on the second reticle during inspecting the first reticle. In some embodiments, moving the first reticle from the first load port to the reticle inspection tool is performed using a first robot arm, and moving the second reticle from the second load port to the exposure tool is performed using a second robot arm. In some embodiments, the first robot arm is located outside the lithography tool, and the second robot arm is located inside the lithography tool. In some embodiments, the method further comprises prior to inspecting the first reticle, calibrating a horizontal relative position of the first reticle with respect to a camera of the reticle inspection tool.

In some embodiments, the method further comprises prior to inspecting the first reticle, calibrating a vertical relative position of the first reticle with respect to a camera of the reticle inspection tool. In some embodiments, the method further comprises prior to inspecting the first reticle, calibrating an orientation of the first reticle with respect to a camera of the reticle inspection tool. In some embodiments, inspecting the first reticle comprises capturing an image of the first reticle by using a camera of the reticle inspection tool. In some embodiments, determining whether the first reticle is acceptable for exposure comprises determining whether a size of an identified particle in the captured image of the first reticle exceeds a particle size threshold. In some embodiments, determining whether the first reticle is acceptable for exposure comprises determining whether an identified particle count in the captured image of the first reticle exceeds a particle count threshold. In some embodiments, the method further comprises after purging the first reticle, inspecting the first reticle using the reticle inspection tool again.

In some embodiments, a method comprises moving, by using a first robot arm, a first reticle from a first load port of a lithography tool to a reticle inspection tool; moving, by using a second robot arm, a second reticle from a second load port of the lithography tool to an exposure tool of the lithography tool; inspecting the first reticle using the reticle inspection tool; and during inspecting the first reticle using the reticle inspection tool, performing an exposure process on the second reticle using the exposure tool. In some embodiments, the reticle inspection tool is outside the lithography tool. In some embodiments, the method further comprises after inspecting the first reticle, determining whether a particle on the first reticle has a size exceeding a size threshold; and when the determination determines that the size of the particle exceeds the size threshold, purging the first reticle. In some embodiments, purging the first reticle is performed automatedly using a gas knife. In some embodiments, the method further comprises after inspecting the first reticle, determining whether a particle count on the first reticle exceeds a count threshold, and when the determination determines that the particle count exceeds the count threshold, purging the first reticle.

In some embodiments, a tool comprises a reticle inspection tool, a reticle purging tool, a robot arm, an image analyzer, and a purging controller. The reticle inspection tool is outside a lithography tool. The reticle purging tool is outside the lithography tool. The robot arm has a range of motion sufficient to transfer a reticle between a load port of the lithography tool and the reticle inspection tool, and also sufficient to transfer the reticle between the reticle inspection tool and the reticle purging tool. The image analyzer is configured to determine whether a reticle image captured by the reticle inspection tool has an unacceptable particle condition. The purging controller is programmed to activate the reticle purging tool in response to the determination of the image analyzer determines that the reticle image has an unacceptable particle condition. In some embodiments, the robot arm has an inner fork, an outer fork, and an anti-collision bar. The inner fork has a first prong and a second prong and the outer fork has a third and a fourth prong. The first and second prongs are between the third and fourth prong, and the anti-collision bar connects the third and fourth prong and has a top surface higher than top surfaces of the first and second prong. In some embodiments, the tool further comprises a crash sensor disposed on one of the third and fourth prongs of the outer fork.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
moving, by using a robot arm, a first reticle from a first load port of a lithography tool to a reticle inspection tool located outside the lithography tool, wherein the robot arm comprises an inner fork, an outer fork, and an anti-collision bar, wherein the inner fork has a first prong and a second prong and the outer fork has a third prong and a fourth prong, wherein the first and second prongs are between the third and fourth prongs, and the anti-collision bar connects the third and fourth prongs and has a top surface higher than top surfaces of the first and second prongs;
inspecting the first reticle using the reticle inspection tool located outside the lithography tool;
determining whether the first reticle is acceptable for exposure based on a result of inspecting the first reticle; and
in response the determination determines that the first reticle is not acceptable for exposure, purging the first reticle using a gas knife to remove contaminants from the first reticle.

2. The method of claim 1, further comprising:
moving a second reticle from a second load port of the lithography tool to an exposure tool; and
performing an exposure process on the second reticle during inspecting the first reticle.

3. The method of claim 2, wherein moving the first reticle from the first load port to the reticle inspection tool is performed using a first robot arm, and moving the second reticle from the second load port to the exposure tool is performed using a second robot arm.

4. The method of claim 3, wherein the first robot arm is located outside the lithography tool, and the second robot arm is located inside the lithography tool.

5. The method of claim 1, further comprising:
prior to inspecting the first reticle, calibrating a horizontal relative position of the first reticle with respect to a camera of the reticle inspection tool.

6. The method of claim 1, further comprising:
prior to inspecting the first reticle, calibrating a vertical relative position of the first reticle with respect to a camera of the reticle inspection tool.

7. The method of claim 1, further comprising:
prior to inspecting the first reticle, calibrating an orientation of the first reticle with respect to a camera of the reticle inspection tool.

8. The method of claim 1, wherein inspecting the first reticle comprises capturing an image of the first reticle by using a camera of the reticle inspection tool.

9. The method of claim 8, wherein determining whether the first reticle is acceptable for exposure comprises:

determining whether a size of an identified particle in the captured image of the first reticle exceeds a particle size threshold.

10. The method of claim 8, wherein determining whether the first reticle is acceptable for exposure comprises:
determining whether an identified particle count in the captured image of the first reticle exceeds a particle count threshold.

11. The method of claim 1, further comprising:
after purging the first reticle, inspecting the first reticle using the reticle inspection tool again.

12. The method of claim 1, wherein the robot arm further comprises a crash sensor disposed on one of the third and fourth prongs of the outer fork.

13. A method, comprising:
moving, by using a first robot arm, a first reticle from a first load port of a lithography tool to a reticle inspection tool, wherein the first robot arm comprises an inner fork, an outer fork, and an anti-collision bar, wherein the inner fork has a first prong and a second prong and the outer fork has a third prong and a fourth prong, wherein the first and second prongs are between the third and fourth prongs, and the anti-collision bar connects the third and fourth prongs and has a top surface higher than top surfaces of the first and second prongs;
moving, by using a second robot arm, a second reticle from a second load port of the lithography tool to an exposure tool of the lithography tool;
inspecting the first reticle using the reticle inspection tool; and
during inspecting the first reticle using the reticle inspection tool, performing an exposure process on the second reticle using the exposure tool to transfer a pattern onto a semiconductor substrate.

14. The method of claim 13, wherein the reticle inspection tool is outside the lithography tool.

15. The method of claim 13, further comprising:
after inspecting the first reticle, determining whether a particle on the first reticle has a size exceeding a size threshold; and
when the determination determines that the size of the particle exceeds the size threshold, purging the first reticle.

16. The method of claim 15, wherein purging the first reticle is performed automatedly using a gas knife.

17. The method of claim 13, further comprising:
after inspecting the first reticle, determining whether a particle count on the first reticle exceeds a count threshold; and
when the determination determines that the particle count exceeds the count threshold, purging the first reticle.

18. The method of claim 17, wherein purging the first reticle is performed automatedly using a gas knife.

19. A tool comprising:
a reticle inspection tool outside a lithography tool;
a reticle purging tool outside the lithography tool, the reticle purging tool comprising a gas knife;
a robot arm having a range of motion sufficient to transfer a reticle between a load port of the lithography tool and the reticle inspection tool, and also sufficient to transfer the reticle between the reticle inspection tool and the reticle purging tool, wherein the robot arm comprises an inner fork, an outer fork, and an anti-collision bar, wherein the inner fork has a first prong and a second prong and the outer fork has a third prong and a fourth prong, wherein the first and second prongs are between the third and fourth prongs, and the anti-collision bar connects the third and fourth prongs and has a top surface higher than top surfaces of the first and second prongs;

an image analyzer configured to determine whether a reticle image captured by the reticle inspection tool has an unacceptable particle condition; and a purging controller programmed to activate the gas knife of the reticle purging tool to blow particles away from the reticle, in response to a determination of the image analyzer determines that the reticle image has an unacceptable particle condition.

20. The tool of claim 18, further comprising:

a crash sensor disposed on one of the third and fourth prongs of the outer fork.

\* \* \* \* \*